(12) United States Patent
Chiang et al.

(10) Patent No.: US 10,658,247 B2
(45) Date of Patent: May 19, 2020

(54) FINFET DEVICES AND METHODS OF FORMING

(71) Applicant: Taiwan Semiconductor Manufacturing Company, Ltd., Hsinchu (TW)

(72) Inventors: Kuo-Cheng Chiang, Zhubei (TW); Chi-Wen Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/230,675

(22) Filed: Dec. 21, 2018

(65) Prior Publication Data

US 2019/0148244 A1    May 16, 2019

Related U.S. Application Data

(60) Continuation of application No. 15/888,887, filed on Feb. 5, 2018, now Pat. No. 10,163,726, which is a
(Continued)

(51) Int. Cl.
*H01L 21/8238* (2006.01)
*H01L 27/092* (2006.01)
(Continued)

(52) U.S. Cl.
CPC ........... *H01L 21/823807* (2013.01); *H01L 21/823814* (2013.01); *H01L 21/823821* (2013.01);
(Continued)

(58) Field of Classification Search
CPC ......... H01L 21/823807; H01L 29/7848; H01L 29/0649; H01L 29/165; H01L 29/1054;
(Continued)

(56) References Cited

U.S. PATENT DOCUMENTS 7,425,740 B2   9/2008  Liu et al.
7,667,271 B2   2/2010  Yu et al.
(Continued)

FOREIGN PATENT DOCUMENTS

KR        101370716 B1    3/2014
KR     20140034347 A      3/2014

*Primary Examiner* — William F Kraig
*Assistant Examiner* — Vicki B. Booker
(74) *Attorney, Agent, or Firm* — Slater Matsil, LLP

(57) ABSTRACT

In accordance with some embodiments, a device includes first and second p-type transistors. The first transistor includes a first channel region including a first material of a first fin. The first transistor includes first and second epitaxial source/drain regions each in a respective first recess in the first material and on opposite sides of the first channel region. The first transistor includes a first gate stack on the first channel region. The second transistor includes a second channel region including a second material of a second fin. The second material is a different material from the first material. The second transistor includes third and fourth epitaxial source/drain regions each in a respective second recess in the second material and on opposite sides of the second channel region. The second transistor includes a second gate stack on the second channel region.

20 Claims, 15 Drawing Sheets

Related U.S. Application Data continuation of application No. 15/268,837, filed on Sep. 19, 2016, now Pat. No. 9,887,137, which is a division of application No. 14/739,895, filed on Jun. 15, 2015, now Pat. No. 9,449,975.

(51) Int. Cl.

| | | |
|---|---|---|
| *H01L 29/161* | (2006.01) | |
| *H01L 29/16* | (2006.01) | |
| *H01L 29/08* | (2006.01) | |
| *H01L 29/66* | (2006.01) | |
| *H01L 29/78* | (2006.01) | |
| *H01L 29/06* | (2006.01) | |
| *H01L 29/10* | (2006.01) | |
| *H01L 29/165* | (2006.01) | |

(52) U.S. Cl.
CPC ...... *H01L 27/0922* (2013.01); *H01L 27/0924* (2013.01); *H01L 29/0649* (2013.01); *H01L 29/0847* (2013.01); *H01L 29/1054* (2013.01); *H01L 29/16* (2013.01); *H01L 29/161* (2013.01); *H01L 29/165* (2013.01); *H01L 29/66545* (2013.01); *H01L 29/7848* (2013.01); *H01L 21/823864* (2013.01)

(58) Field of Classification Search
CPC ....... H01L 29/66545; H01L 21/823814; H01L 21/823821; H01L 29/0847; H01L 29/161; H01L 29/16; H01L 27/0922; H01L 27/0924; H01L 21/823864; H01L 27/0886; H01L 21/823431
See application file for complete search history.

(56) References Cited

U.S. PATENT DOCUMENTS

| | | | |
|---|---|---|---|
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,664,060 B2 | 3/2014 | Liu et al. | |
| 8,680,576 B2 | 3/2014 | Ching et al. | |
| 8,703,565 B2 | 4/2014 | Chang et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,887,106 B2 | 11/2014 | Ho et al. | |
| 2011/0068407 A1 | 3/2011 | Yeh et al. | |
| 2011/0248352 A1 | 10/2011 | Shifren et al. | |
| 2011/0284967 A1 | 11/2011 | Cheng et al. | |
| 2013/0011983 A1 | 1/2013 | Tsai et al. | |
| 2013/0200470 A1 | 8/2013 | Liu et al. | |
| 2013/0228866 A1 | 9/2013 | Lee et al. | |
| 2013/0285153 A1 | 10/2013 | Lee et al. | |
| 2014/0061814 A1 | 3/2014 | Kim et al. | |
| 2014/0183600 A1 | 7/2014 | Huang et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2015/0035023 A1 | 2/2015 | Kim et al. | |
| 2015/0041918 A1 | 2/2015 | Wann et al. | |
| 2015/0318282 A1* | 11/2015 | Rodder | H01L 21/823418 257/392 |

\* cited by examiner

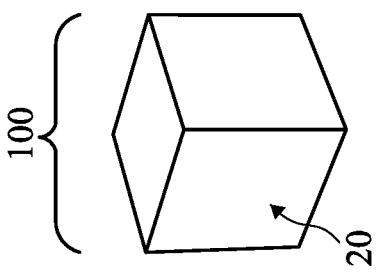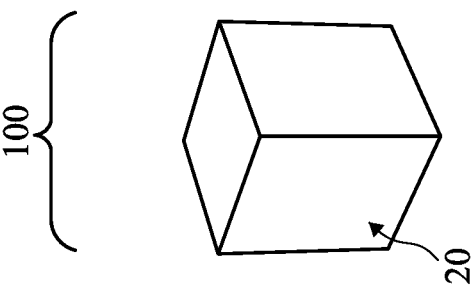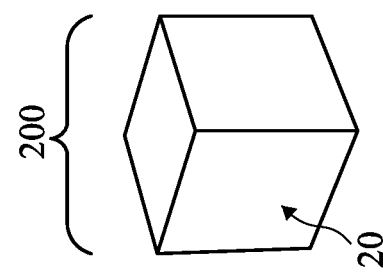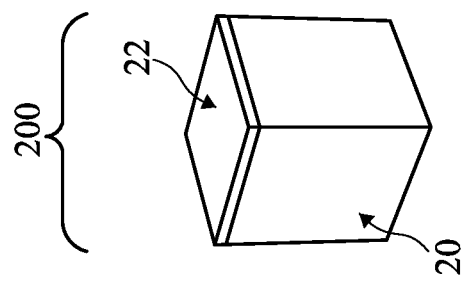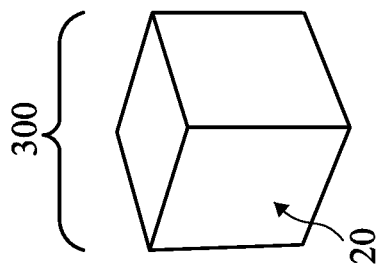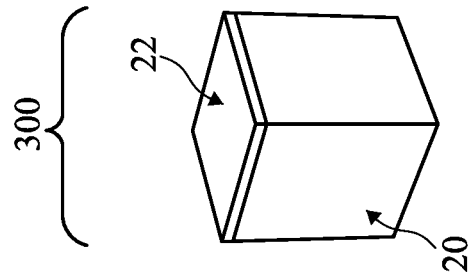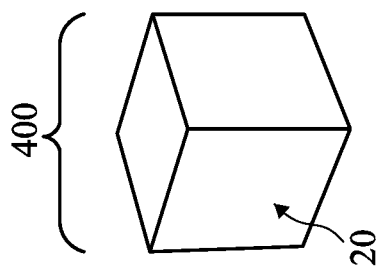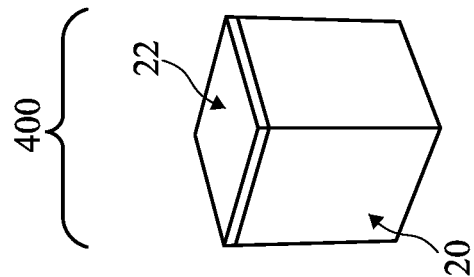
Fig. 1
Fig. 2

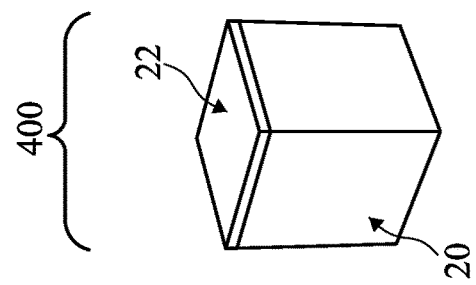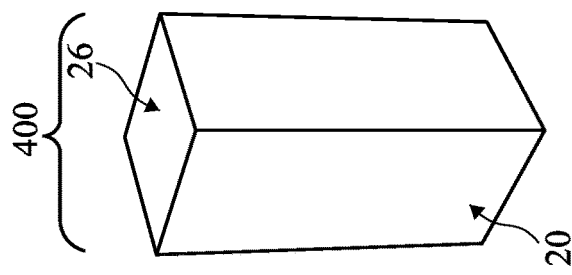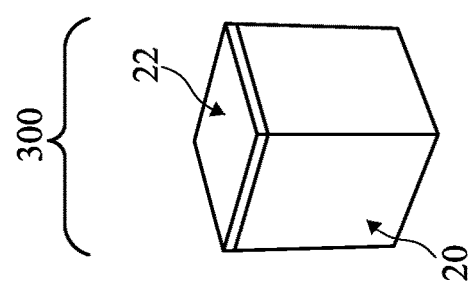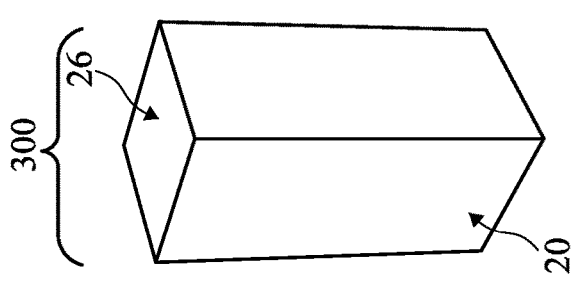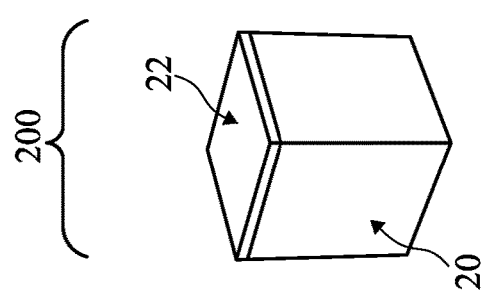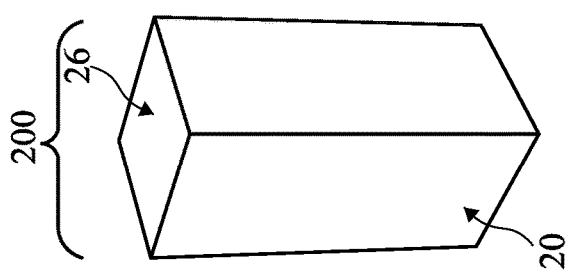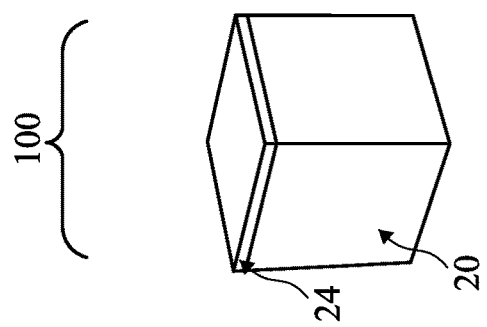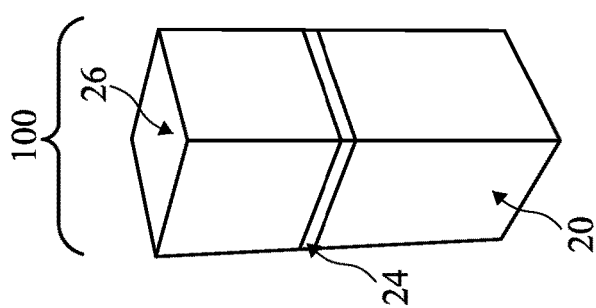
Fig. 3
Fig. 4

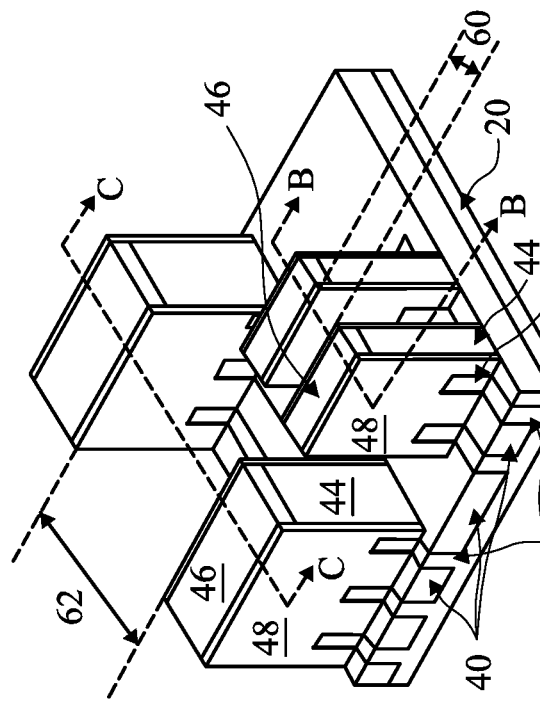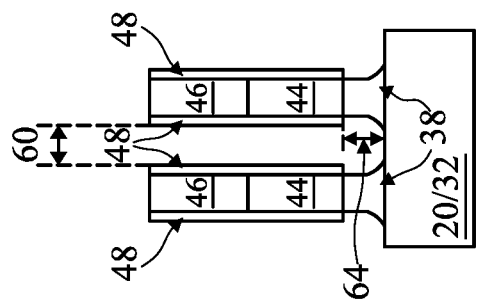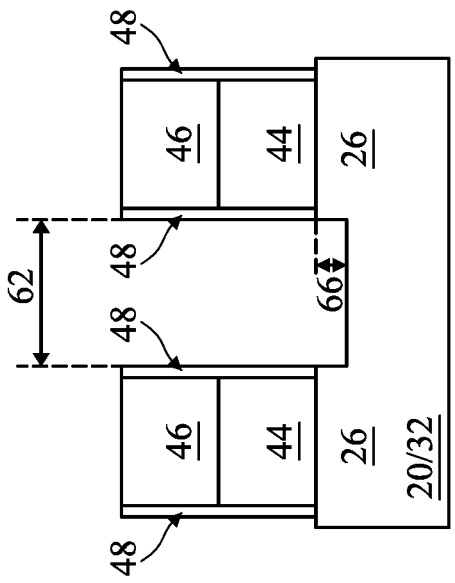
Fig. 13A  Fig. 13B  Fig. 13C
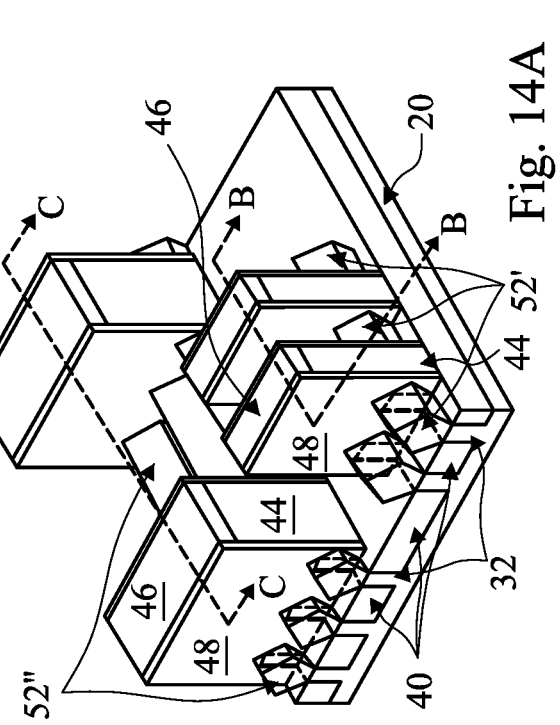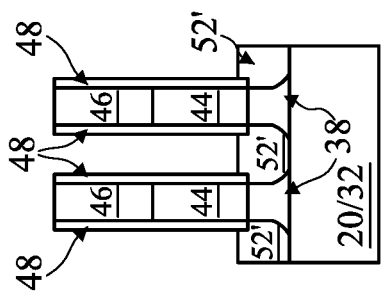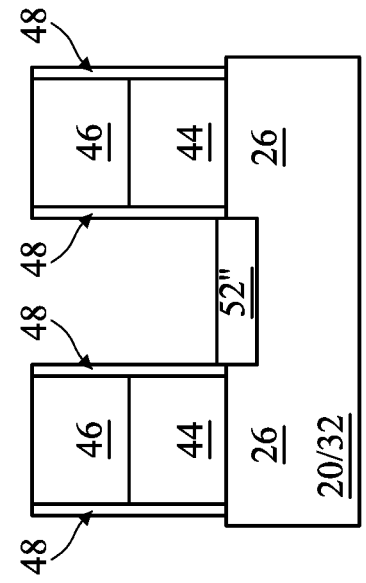
Fig. 14A  Fig. 14B  Fig. 14C

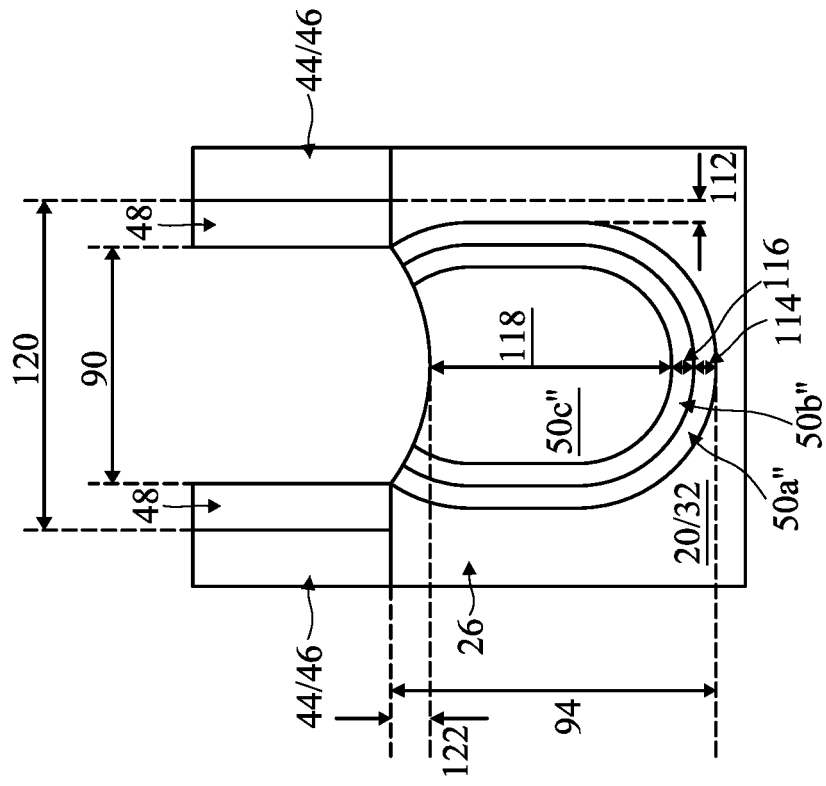
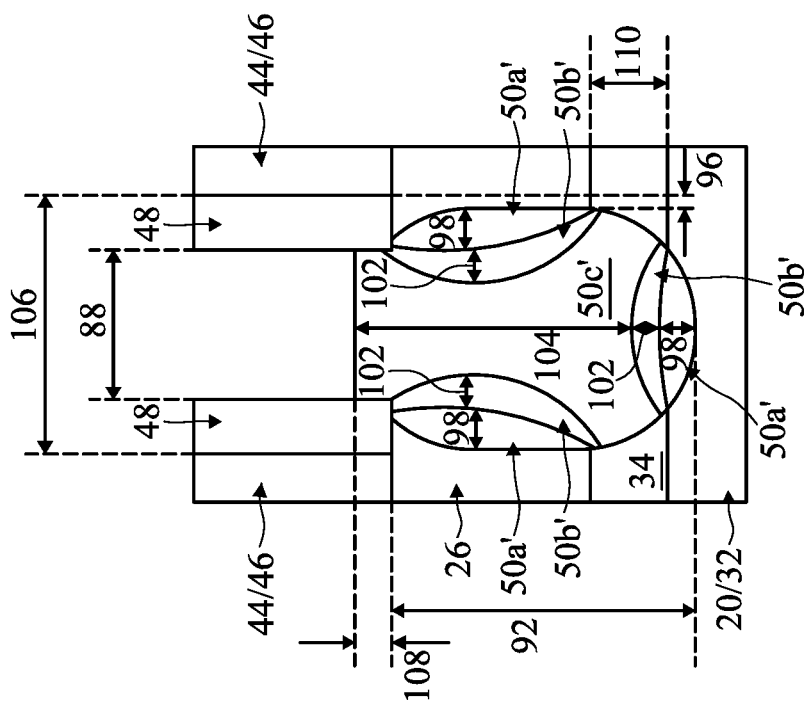

US 10,658,247 B2

FINFET DEVICES AND METHODS OF FORMING

PRIORITY CLAIM AND CROSS-REFERENCE

This application is a continuation of U.S. patent application Ser. No. 15/888,887, filed Feb. 5, 2018, which is a continuation of U.S. patent application Ser. No. 15/268,837, filed on Sep. 19, 2016, (now U.S. Pat. No. 9,887,137, issued Feb. 6, 2018), which is a divisional of U.S. patent application Ser. No. 14/739,895, filed on Jun. 15, 2015 (now U.S. Pat. No. 9,449,975, issued Sep. 20, 2016), which applications are hereby incorporated herein by reference.

BACKGROUND

The reduction of the size and the inherent features of semiconductor devices (e.g., field effect transistor (FET) devices) has enabled continued improvement in speed, performance, density, and cost per unit function of integrated circuits over the past few decades. In accordance with a design of the FET devices and one of the inherent characteristics thereof, modulating the length of a channel region underlying a gate between a source and drain of a FET device alters a resistance associated with the channel region, thereby affecting a performance of the FET device. More specifically, shortening the length of the channel region reduces a source-to-drain resistance of the FET device, which, assuming other parameters are maintained relatively constant, may allow an increase in current flow between the source and drain when a sufficient voltage is applied to the gate of the MOS device.

To further enhance the performance of FET devices, stress may be introduced in the channel region of a FET device to improve carrier mobility. Generally, it is desirable to induce a tensile stress in the channel region of an n-type FET ("NFET") device in a source-to-drain direction, and to induce a compressive stress in the channel region of a p-type FET ("PFET") device in a source-to-drain direction.

A commonly used method for applying compressive stress to the channel regions of FET devices includes growing stressors in the source and drain regions. Such a method typically includes the steps of forming a gate stack on a semiconductor substrate, forming gate spacers on sidewalls of the gate stack, forming recesses in the silicon substrate along the gate spacers, and epitaxially growing stressors in the recesses. Since the stressors have a lattice constant different from that of silicon, it expands and applies a stress to the channel region, which is located between a source stressor and a drain stressor.

The above-discussed method is affected by pattern-loading effects, which occur due to a difference in pattern densities. The pattern-loading effects pertain to a phenomenon occurring upon simultaneous etching of a semiconductor substrate in a region of a higher pattern density and a region of a lower pattern density. The profiles of the trenches are related to the density of patterns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 12 are various three-dimensional (3D) views of intermediate stages in the manufacturing of fin Field Effect Transistors (finFETs) in accordance with some embodiments FIGS. 13A, 13B, and 13C are a 3D view and cross-sectional views illustrating recessing of source/drain regions in first and second regions in accordance with some embodiments.

FIGS. 14A, 14B, and 14C are a 3D view and cross-sectional views illustrating formation of epitaxial source/drain regions in the recesses formed in FIGS. 13A, 13B, and 13C in accordance with some embodiments.

FIG. 19 is a cross-sectional view of an epitaxial source/drain region in a third region in accordance with some embodiments.

FIG. 20 is a cross-sectional view of an epitaxial source/drain region in a fourth region in accordance with some embodiments.

DETAILED DESCRIPTION

Figure 5:
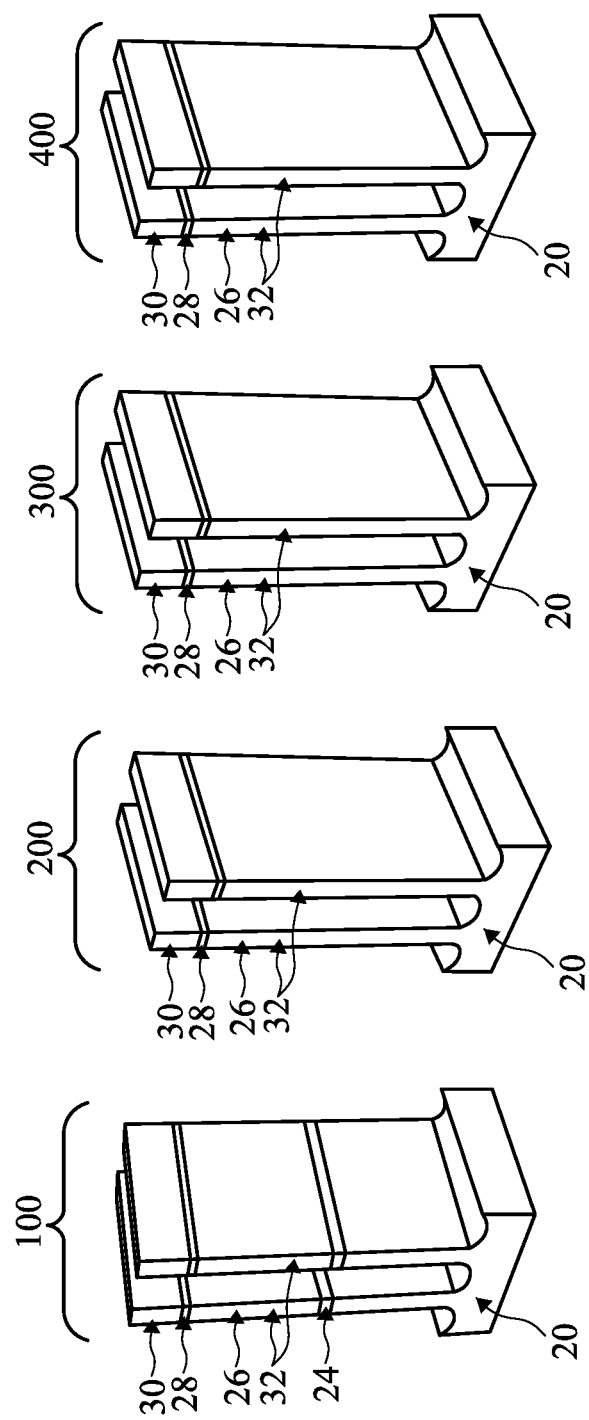

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (finFETs) and methods of forming the same are provided in accordance with various embodiments. Intermediate stages of forming finFETs are illustrated. Some embodiments discussed herein are discussed in the context of finFETs formed using a gate-last process. Some embodiments contemplate aspects used in a gate-first process. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIGS. 1 through 12 are various three-dimensional (3D) views of intermediate stages in the manufacturing of finFETs in accordance with some embodiments. In FIG. 1, a substrate 20 is provided. The substrate 20 may be a semiconductor substrate, such as a bulk semiconductor substrate, a semiconductor-on-insulator (SOI) substrate, a multi-layered or gradient substrate, or the like. The substrate 20 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 20 may be doped or un-doped. In a specific example, the substrate 20 is a bulk silicon substrate. The substrate 20 comprises a first region 100, a second region 200, a third region 300, and a fourth region 400. Although the regions 100, 200, 300, and 400 are depicted separately, the regions 100, 200, 300, and 400 are generally respective portions of a same substrate 20, and the specific depictions in the figures are solely for clarity. In the context of the examples provided herein, the first region 100 may be a core logic n-type device region; the second region 200 may be a core logic p-type device region; the third region 300 may be an input/output (I/O) p-type device region; and the fourth region 400 may be a I/O n-type device region.

In FIG. 2, a hardmask 22 is formed on the substrate 20 in the second region 200, the third region 300, and the fourth region 400. The hardmask 22 can be formed by oxidizing, such as a thermal oxidation, chemical oxidation, or the like, a surface of the substrate 20 to form the hardmask 22 across the first region 100, the second region 200, the third region 300, and the fourth region 400 and subsequently etching the hardmask 22 in the first region 100 to expose the substrate 20 in the first region 100. The etching may use acceptable photolithography and etching techniques. Other materials and methods of forming the hardmask 22 may be used.

In FIG. 3, a semiconductor layer 24 is formed on the substrate 20 in the first region 100 while the substrate 20 in the second region 200, the third region 300, and the fourth region 400 remains masked by the hardmask 22. The semiconductor layer 24 can be any semiconductor material that is capable of easily oxidizing relative to the material(s) of the substrate 20 and a subsequently formed regrowth layer, as will be discussed. In some embodiments, the semiconductor layer 24 is a germanium (Ge) containing material, such as SiGe. The semiconductor layer 24 can be epitaxially grown, such as by Metal-Organic Chemical Vapor Deposition (MOCVD), Molecular Beam Epitaxy (MBE), Liquid Phase Epitaxy (LPE), Vapor Phase Epitaxy (VPE), the like, or a combination thereof. A thickness of the semiconductor layer 24 can be in a range from about 3 nm to about 15 nm.

In FIG. 4, the hardmask 22 is removed from the second region 200, the third region 300, and the fourth region 400 of the substrate 20. The removal may be by using any appropriate etch, such as an etch selective to the material of the hardmask 22. For example, the etch may be a wet etch, such as a diluted HF etch, or the like when the hardmask 22 is an oxide. The etch may be performed in situ after the semiconductor layer 24 is formed.

Further in FIG. 4, a regrowth layer 26 is formed on the semiconductor layer 24 in the first region 100 and on the substrate 20 in the second region 200, the third region 300, and the fourth region 400. The regrowth layer 26 may be a same material as the substrate 20. For example, in an embodiment where the substrate 20 is a bulk silicon substrate, the regrowth layer 26 may be silicon. The regrowth layer 26 can be epitaxially grown, such as by MOCVD, MBE, LPE, VPE, the like, or a combination thereof. A thickness of the regrowth layer 26 can be in a range from about 30 nm to about 60 nm. The regrowth layer 26 may be planarized, such as by a chemical mechanical polish (CMP).

In FIG. 5, a pad layer 28 and a hardmask layer 30 are formed on the regrowth layer 26. The pad layer 28 can be an oxide formed by oxidizing, such as by a thermal oxidation, chemical oxidation, or the like, a surface of the regrowth layer 26. The hardmask layer 30 can be silicon nitride, silicon carbon nitride, silicon oxynitride, silicon carbon oxynitride, the like, or a combination thereof deposited by chemical vapor deposition (CVD) or the like. Other materials and methods of forming the pad layer 28 and the hardmask layer 30 may be used.

Further in FIG. 5, the hardmask layer 30 and the pad layer 28 are patterned and used as masks to form fins 32. The patterning of the hardmask layer 30 and the pad layer 28 may use any acceptable photolithography and etching process, such as a reactive ion etch (RIE), neutral beam etch (NBE), or the like. Similarly, using the hardmask layer 30 and the pad layer 28 as masks, the regrowth layer 26, the semiconductor layer 24, and/or the substrate 20 are etched to form the fins 32. The etching may use any acceptable etching process, such as RIE, NBE, or the like. The etching can form trenches between the fins 32. The fins 32 in the first region 100, as illustrated, comprise the regrowth layer 26, the semiconductor layer 24, and the substrate 20. The fins 32 in the second region 200, as illustrated, comprise the regrowth layer 26 and the substrate 20. The fins 32 in the third region 300, as illustrated, comprise the regrowth layer 26 and the substrate 20. The fins 32 in the fourth region 400, as illustrated, comprise the regrowth layer 26 and the substrate 20.

Figure 6:
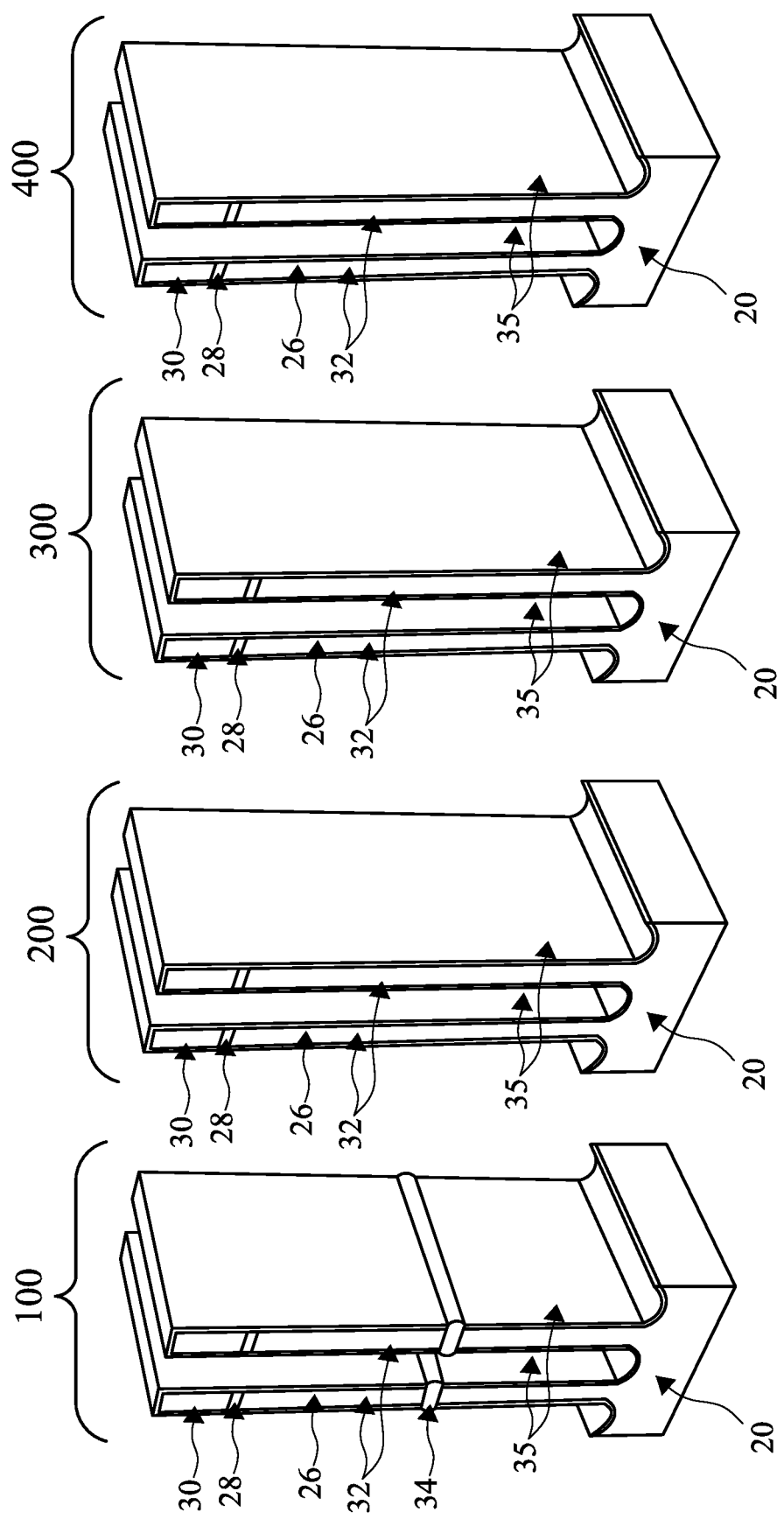

In FIG. 6, the semiconductor layer 24 in the fins 32 in the first region 100 is converted to a first dielectric material 34. In some embodiments, the conversion process is an oxidation process. The oxidation process may use a steam furnace. For example, the substrate 20 may be placed in a furnace such that the substrate 20 is exposed to a steam environment. As illustrated in FIG. 6, when a steam environment is used for oxidation, the steam may reach the semiconductor layer 24 to convert the semiconductor layer 24 to the first dielectric material 34. In some embodiments, such as when the semiconductor layer 24 is SiGe, the first dielectric material 34 may be SiGeO. Other conversion processes may be used. During the conversion process, a second dielectric material 35 may be formed on the surfaces of the fins 32. For example, the surfaces of the fins 32 may also oxidize during an oxidation process.

Figure 7:
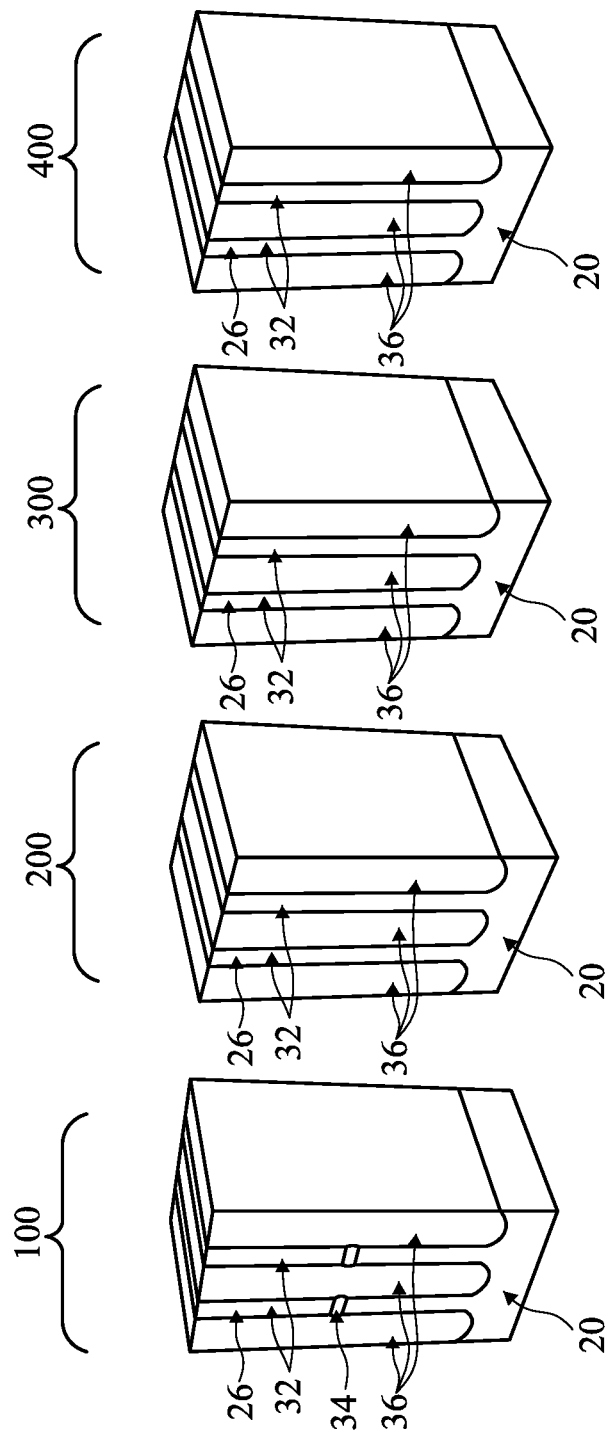

In FIG. 7, the trenches are filled with an insulation material 36. The insulation material 36 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 36 is silicon oxide formed by a FCVD process. An anneal process may be performed once the insulation material 36 is formed. Further, a planarization process, such as a CMP, may remove any excess insulation material, the hardmask layer 30, and the pad layer 28, and may form top surfaces of the insulation material 36 and top surfaces of the fins 32 that are co-planar.

Figure 8:
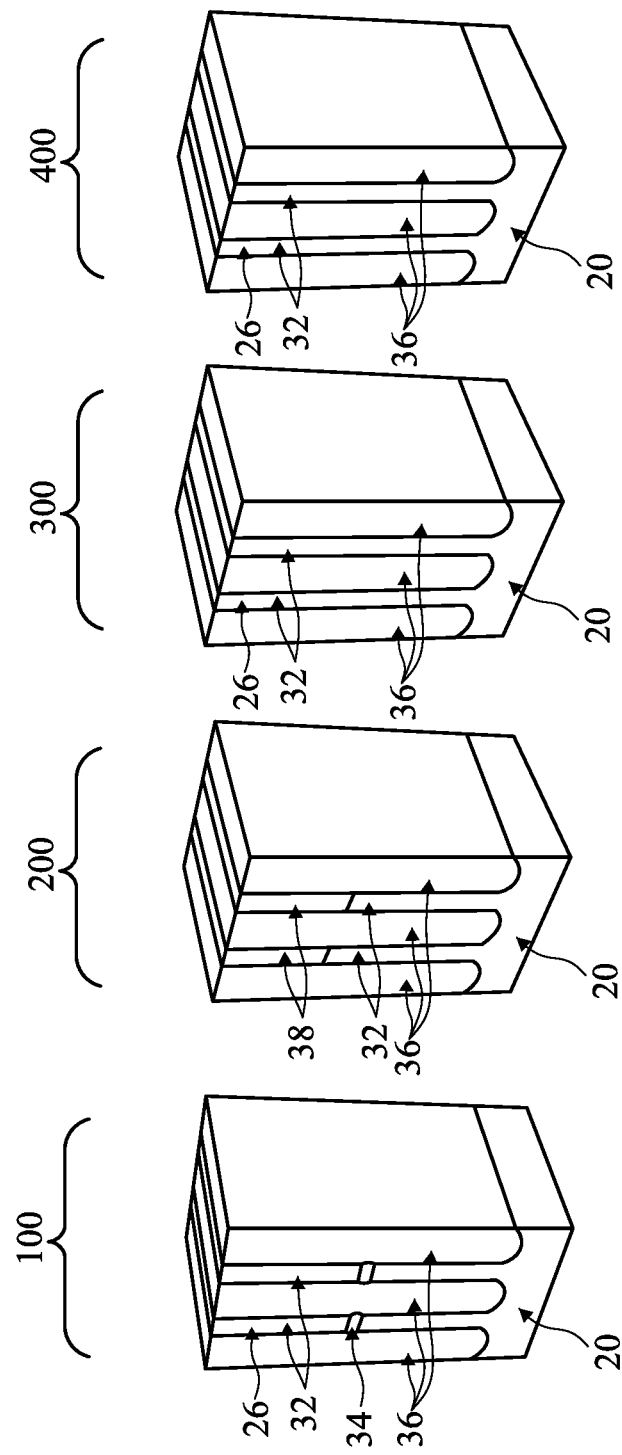

In FIG. 8, portions of the fins 32 in the second region 200 are removed, and a heteroepitaxial layer 38 is formed as respective portions of the fins 32 in the second region 200. A hardmask layer may be formed in the first region 100, the third region 300, and the fourth region 400 while the fins 32 in the second region 200 remain exposed. The hardmask layer can be silicon nitride, silicon carbon nitride, silicon oxynitride, silicon carbon oxynitride, the like, or a combination thereof deposited by chemical vapor deposition (CVD) or the like. Other materials and methods of forming the hardmask layer may be used. The hardmask layer may be patterned to expose the second region 200 using any acceptable photolithography and etching process, such as RIE, NBE, or the like. With the second region 200 exposed and while the first region 100, the third region 300, and the fourth region 400 are masked, an etch selective to the material(s) of the fins 32 in the second region 200 is performed. The etch can be any acceptable etch, such as a dry etch using a F-based gas, Cl-based gas, or the like. The etch recesses the fins 32 in the second region 200.

Then, the heteroepitaxial layer 38 is formed in the recesses. The heteroepitaxial layer 38 can be epitaxially grown, such as by MOCVD, MBE, LPE, VPE, the like, or a combination thereof. The heteroepitaxial layer 38 can include any material for an acceptable application of the finFETs to be formed in the second region 200. In some embodiments, the heteroepitaxial layer 38 is silicon germanium, for example, $Si_xGe_{1-x}$, where x can be in a range from about 0.50 to 0.80, when the regrowth layer 26 (if any remains in the second region 200) and/or the substrate 20 are silicon. A planarization process, such as a CMP, may remove any excess heteroepitaxial layer 38 and the hardmask layer, and may form top surfaces of the heteroepitaxial layer 38 and top surfaces of the insulation material 36 that are co-planar. A thickness of the heteroepitaxial layer 38 after the planarization process, if used, can be in a range from about 30 nm to about 60 nm. The fins 32 in the second region 200 include the heteroepitaxial layer 38.

Although not specifically illustrated, appropriate wells may be formed in the fins 32 and/or substrate 20. For example, p-wells may be formed in the first region 100 and the fourth region 400 of the substrate 20 where n-type devices, such as n-type finFETs, are to be formed, and n-wells may be formed in the second region 200 and the third region 300 of the substrate 20 where p-type devices, such as p-type finFETs, are to be formed.

For example, to form a p-well in the first region 100 and the fourth region 400, a photoresist can formed over the fins 32 and insulation material 36 in the second region 200 and the third region 300 of the substrate 20. The photoresist can be patterned to expose the first region 100 and the fourth region 400 of the substrate 20. The photoresist can be formed by using a spin-on technique and can be patterned using acceptable photolithography techniques. Once the photoresist is patterned, a p-type impurity implant can be performed in the first region 100 and the fourth region 400, and the photoresist may act as a mask to substantially prevent p-type impurities from being implanted into the second region 200 and the third region 300. The p-type impurities may be boron, $BF_2$, or the like implanted in the first region 100 and the fourth region 400 to a concentration of equal to or less than about $10^{18}$ cm$^{-3}$, such as between about $10^{17}$ cm$^{-3}$ and about $10^{18}$ cm$^{-3}$. After the implant, the photoresist can be removed, such as by an acceptable ashing process.

Further, to form an n-well in the second region 200 and the third region 300, a photoresist can be formed over the fins 32 and insulation material 36 in the first region 100 and the fourth region 400 of the substrate 20. The photoresist can be patterned to expose the second region 200 and the third region 300 of the substrate 20. The photoresist can be formed by using a spin-on technique and can be patterned using acceptable photolithography techniques. Once the photoresist is patterned, an n-type impurity implant may be performed in the second region 200 and the third region 300, and the photoresist may act as a mask to substantially prevent n-type impurities from being implanted into the first region 100 and the fourth region 400. The n-type impurities may be phosphorus, arsenic, or the like implanted in the second region 200 and the third region 300 to a concentration of equal to or less than about $10^{18}$ cm$^{-3}$, such as between about $10^{17}$ cm$^{-3}$ and about $10^{18}$ cm$^{-3}$. After the implant, the photoresist can be removed, such as by an acceptable ashing process. After the implants, an anneal may be performed to activate the p-type and n-type impurities that were implanted. The implantations may form a p-well in the first region 100 and the fourth region 400 and an n-well in the second region 200 and the third region 300.

In other embodiments, a p-well and an n-well may be formed in situ during the epitaxial growth of the regrowth layer 26 and/or heteroepitaxial layer 38. The regrowth layer 26 in the different regions where different wells are to be formed can be epitaxially grown in different growth steps to allow for the different doping types to be in the different regions.

Figure 9:
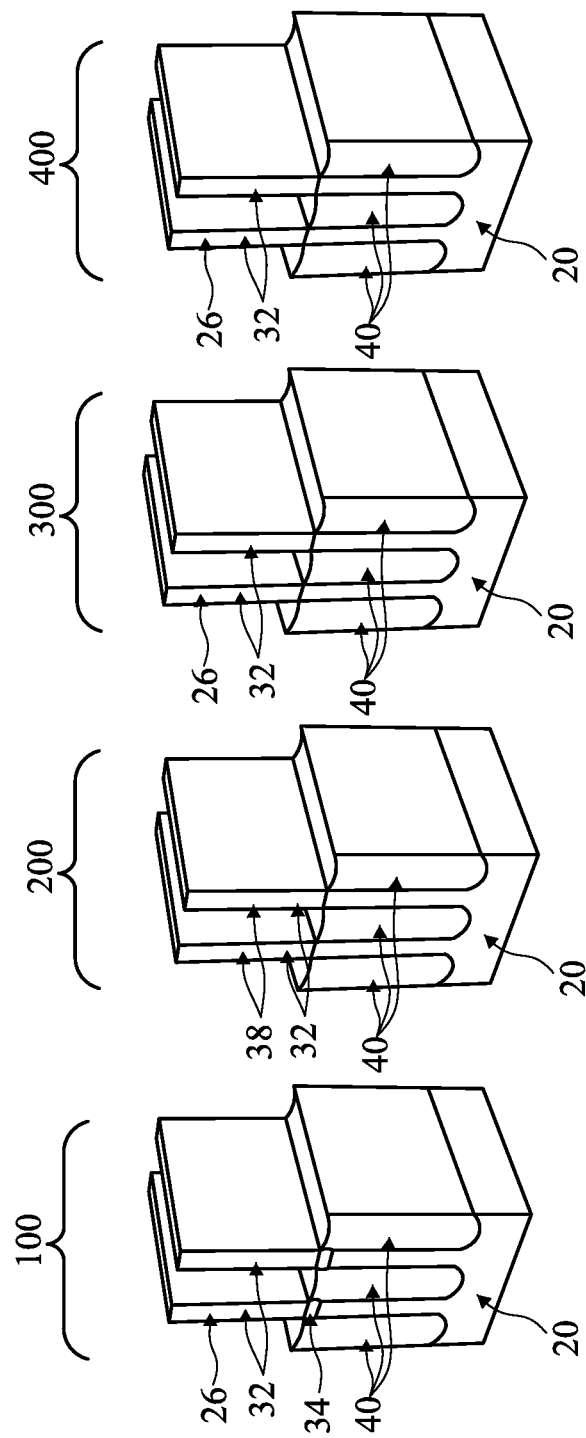

In FIG. 9, the insulation material 36 is recessed to form isolation regions 40, which may be referred to as Shallow Trench Isolation (STI) regions, and to cause the fins 32 to protrude from between neighboring isolation regions 40. The insulation material 36 may be recessed using an acceptable etching process, such as one that is selective to the material of the insulation material 36. For example, a chemical oxide removal using a CERTAS® etch or an Applied Materials SICONI tool or dilute hydrofluoric (dHF) acid may be used.

Figure 10:
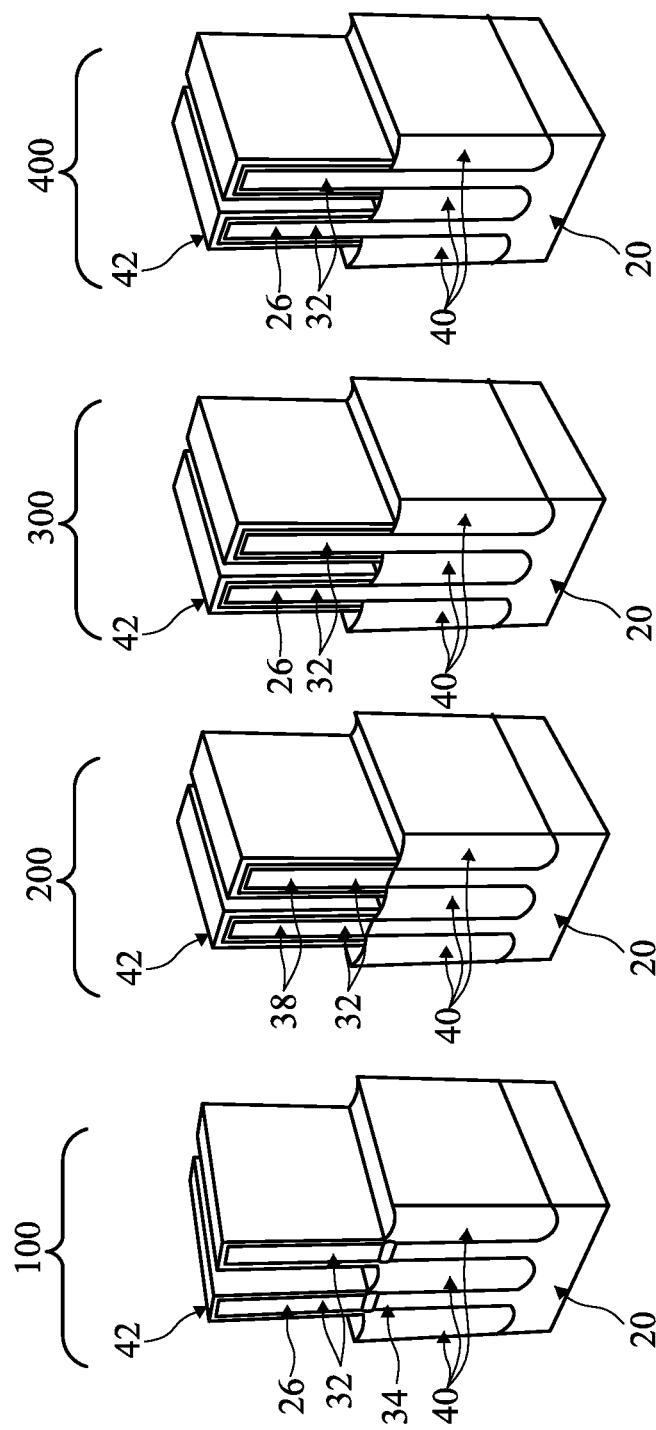

In FIG. 10, a dummy dielectric layer 42 is formed on the fins 32. The dummy dielectric layer 42 may be, for example, silicon oxide, silicon nitride, a combination thereof, or the like, and may be deposited or thermally grown according to acceptable techniques, such as CVD, thermal oxidation, or the like.

Figure 11:
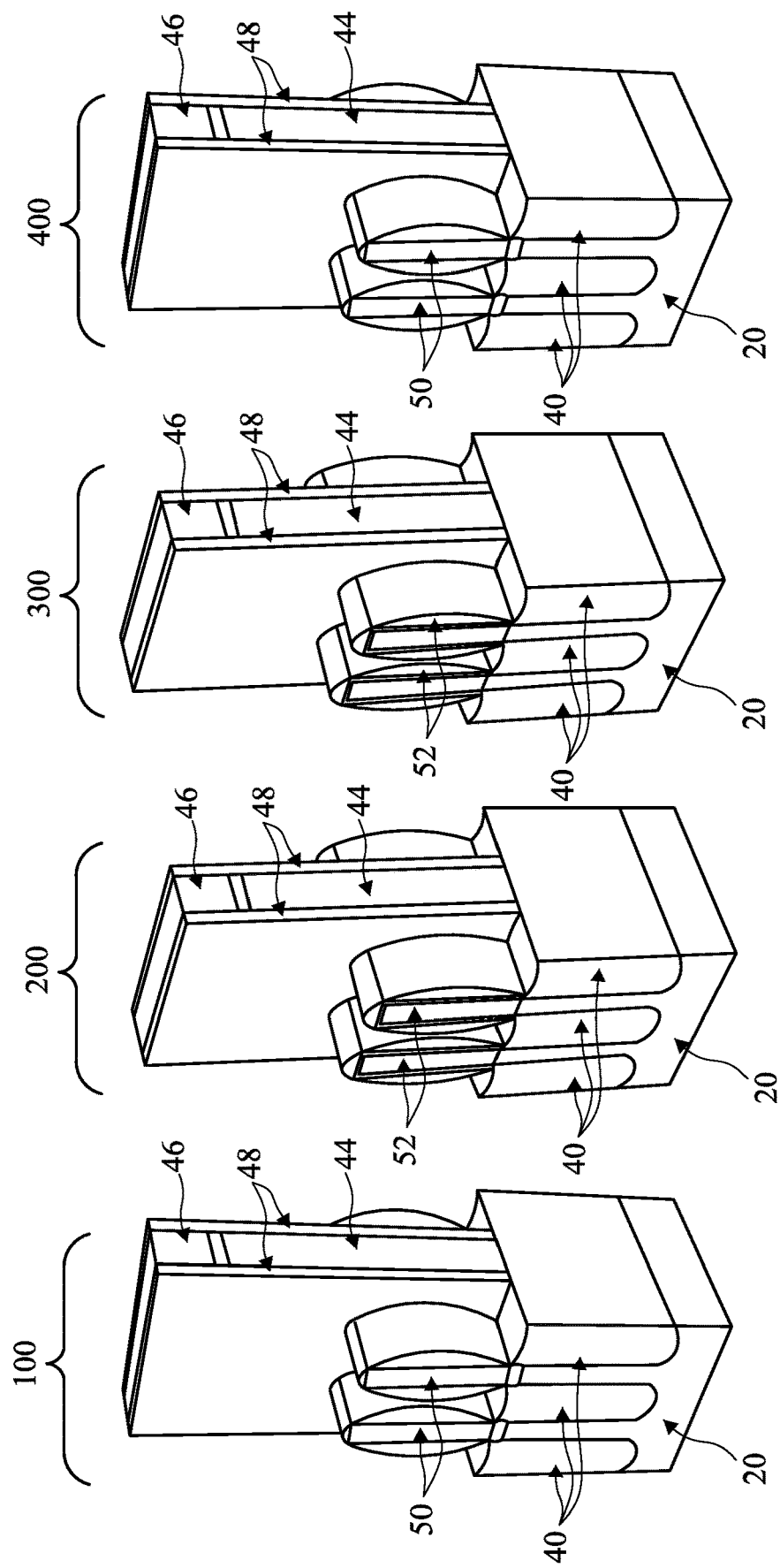

In FIG. 11, a dummy gate layer is formed over the dummy dielectric layer 42. The dummy gate layer may be deposited, such as by using CVD or the like, over the dummy dielectric layer 42 and then planarized, such as by a CMP. The dummy gate layer may comprise, for example, polysilicon, although other materials that have a high etching selectivity may also be used. A mask layer is then formed over the dummy gate layer. The mask layer may be deposited, such as by using CVD or the like, over the dummy gate layer. The mask layer may comprise, for example, silicon nitride, silicon oxynitride, silicon carbon nitride, or the like.

Further in FIG. 11, the mask layer is patterned using acceptable photolithography and etching techniques to form a mask 46. Further, the dummy gate layer and dummy dielectric layer 42 are patterned, such as by transferring the pattern of the mask 46, by using an acceptable etching technique to form dummy gates 44 and dummy gate dielectrics from the dummy gate layer and the dummy dielectric layer 42, respectively. The etching may comprise an acceptable anisotropic etching, such as RIE, NBE, or the like. The dummy gates 44 cover respective channel regions of the fins 32. The dummy gates 44 may also have a lengthwise direction substantially perpendicular to the lengthwise direction of the respective fins 32.

Although not specifically illustrated, implants for lightly doped source/drain (LDD) regions may be performed. Similar to the implants discussed above, a mask, such as a photoresist, may be formed over the second region 200 and the third region 300, e.g., for p-type devices, while exposing the first region 100 and the fourth region 400, e.g., for n-type devices, and n-type impurities may be implanted into the exposed fins 32 in the first region 100 and the fourth region 400. The mask may then be removed. Subsequently, a mask, such as a photoresist, may be formed over the first region 100 and the fourth region 400 while exposing the second region 200 and the third region 300, and p-type impurities may be implanted into the exposed fins 32 in the second region 200 and the third region 300. The mask may then be removed. The n-type impurities may be the any of the n-type impurities previously discussed, and the p-type impurities may be the any of the p-type impurities previously discussed. The lightly doped source/drain regions may have a concentration of impurities from about $10^{15}$ cm$^{-3}$ to about $10^{16}$ cm$^{-3}$. An anneal may be used to activate the implanted impurities.

Further in FIG. 11, gate spacers 48 are formed along sidewalls of the dummy gate dielectric, dummy gate 44, and mask 46. The gate spacers 48 may be formed by conformally depositing, such as by CVD or the like, a material and subsequently anisotropically etching the material. The material of the gate spacers 48 may be silicon nitride, silicon carbon nitride, a combination thereof, or the like.

Further in FIG. 11, epitaxial source/drain regions 50 and 52 are formed in the fins 32. A hardmask layer may be formed in the second region 200 and the third region 300 while the fins 32 in the first region 100 and the fourth region 400 remain exposed. The hardmask layer can be silicon nitride, silicon carbon nitride, silicon oxynitride, silicon carbon oxynitride, the like, or a combination thereof deposited by CVD or the like. Other materials and methods of forming the hardmask layer may be used. The hardmask layer may be patterned to expose the first region 100 and the fourth region 400 using any acceptable photolithography and etching process, such as RIE, NBE, or the like. With the first region 100 and the fourth region 400 exposed and the second region 200 and the third region 300 masked, an etch selective to the material(s) of the fins 32 in the first region 100 and the fourth region 400 is performed. The etch can be any acceptable etch, such as a dry or wet etch, which may be anisotropic or isotropic. In some embodiments, the etch can include a dry etch using a F-based gas, Cl-based gas, or the like. The etch recesses source/drain regions of the fins 32 in the first region 100 and the fourth region 400. Additional details of the recesses formed in the source/drain regions of the fins 32 in the first region 100 and the fourth region 400 are discussed below in the context of FIGS. 17A-C, 18A-C, 19, and 20.

The epitaxial source/drain regions 50 are then epitaxially grown in the recesses in the first region 100 and the fourth region 400. The epitaxial growth may be by using MOCVD, MBE, LPE, VPE, the like, or a combination thereof. The epitaxial source/drain regions 50 may comprise any acceptable material, such as appropriate for the device type, e.g., n-type. For example, the epitaxial source/drain regions 50 for an n-type device may comprise silicon, SiP, SiC, SiCP, the like, or a combination thereof. Additional details of an example of the epitaxial source/drain regions 50 in the first region 100 and the fourth region 400 are discussed below in the context of FIGS. 18A-C, 19, and 20. Then, the hardmask layer may be removed from the second region 200 and the third region 300, for example, using an etch selective to the material of the hardmask layer.

Another hardmask layer may be formed in the first region 100 and the fourth region 400 while the fins 32 in the second region 200 and the third region 300 remain exposed. The hardmask layer can be silicon nitride, silicon carbon nitride, silicon oxynitride, silicon carbon oxynitride, the like, or a combination thereof deposited by CVD or the like. Other materials and methods of forming the hardmask layer may be used. The hardmask layer may be patterned to expose the second region 200 and the third region 300 using any acceptable photolithography and etching process, such as RIE, NBE, or the like. With the second region 200 and the third region 300 exposed and the first region 100 and the fourth region 400 masked, an etch selective to the material(s) of the fins 32 in the second region 200 and the third region 300 is performed. The etch can be any acceptable etch, such as a dry or wet etch, which may be anisotropic or isotropic. In some embodiments, the etch can include a dry etch using a F-based gas, Cl-based gas, or the like. The etch recesses source/drain regions of the fins 32 in the second region 200 and the third region 300. Additional details of the recesses formed in the source/drain regions of the fins 32 in the second region 200 and the third region 300 are discussed below in the context of FIGS. 13A-C, 14A-C, 15, and 16.

The epitaxial source/drain regions 52 are then epitaxially grown in the recesses in the second region 200 and the third region 300. The epitaxial growth may be by using MOCVD, MBE, LPE, VPE, the like, or a combination thereof. The epitaxial source/drain regions 52 may comprise any acceptable material, such as appropriate for the device type, e.g., p-type. For example, the epitaxial source/drain regions 52 for a p-type device may comprise SiGe, SiGeB, Ge, GeSn, or the like. Additional details of an example of the epitaxial source/drain regions 52 in the second region 200 and the third region 300 are discussed below in the context of FIGS. 14A-C, 15, and 16. Then, the hardmask layer may be removed from the first region 100 and the fourth region 400, for example, using an etch selective to the material of the hardmask layer.

Figure 12:
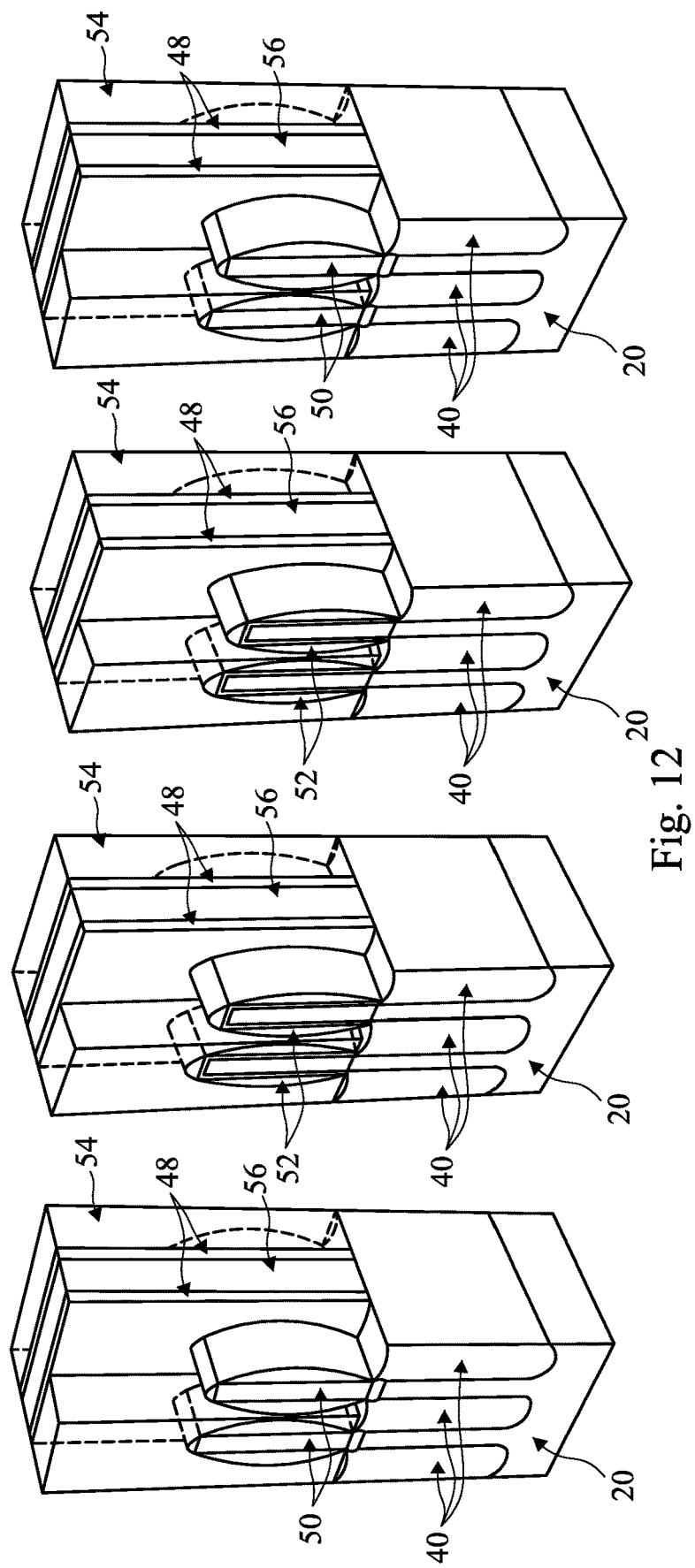

In FIG. 12, a bottom inter-layer dielectric (ILD0) 54 is formed over the fins 32. The ILD0 54 can comprise a first layer, such as an etch stop layer (ESL), conformally formed on the epitaxial source/drain regions 50 and 52, the gate spacers 48, the masks 46, and the isolation regions 40. In some embodiments, the ESL may comprise silicon nitride, silicon carbonitride, or the like, formed using Atomic Layer Deposition (ALD), CVD, the like, or a combination thereof. The ILD0 54 can further comprise a second layer deposited over the first layer. The second layer of the ILD0 54 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

A planarization process, such as a CMP, is performed to level the top surface of ILD0 54 with the top surfaces of the dummy gates 44. The CMP may also remove the masks 46 from over the dummy gates 44. Accordingly, top surfaces of the dummy gates 44 are exposed through the ILD0 54.

Then, the dummy gates 44 and the dummy gate dielectric are removed in an etching step(s), so that openings through the ILD0 54 and defined by the gate spacers 48 are formed to the respective fins 32. The openings expose respective channel regions of the fins 32. Each channel region is disposed between a neighboring pair of epitaxial source/drain regions 50 or 52. The etching step(s) may be selective to the materials of the dummy gates 44 and the dummy gate dielectric, which etching may be a dry or wet etching. During the etching, the dummy gate dielectric may be used as an etch stop layer when the dummy gates 44 are etched. The dummy gate dielectric may then be etched after the removal of the dummy gates 44.

In FIG. 12, a gate dielectric and a gate electrode (collectively "gate stack 56") are formed in the opening through the ILD0 54. An interfacial dielectric can be formed in each opening and on the respective fins 32. The interfacial dielectric may be, for example, an oxide or the like. As an example, a first interfacial layer can be formed in the openings and on the fins 32 in the first region 100, the second region 200, the third region 300, and the fourth region 400. The first interfacial layer can be formed using, for example, an ALD oxide deposition conformal to the structures in the regions 100, 200, 300, and 400. Subsequently, a photoresist can be formed in the third region 300 and the fourth region 400 while the first region 100 and the second region remain exposed. The photoresist can be formed by using a spin-on technique and can be patterned using acceptable photolithography techniques. Once the photoresist is patterned, an etch selective to the material of the first interfacial dielectric layer can be performed to remove the first interfacial dielectric layer from the first region 100 and the second region 200. Then, a second interfacial layer can be formed on the fins 32 exposed by the openings in the first region 100 and the second region 200 using, for example, a chemical oxidation to form an oxide. The chemical oxidation can include exposing the fins 32 to a chemical oxidant, such as ozone, water, hydrogen peroxide, or the like. Hence, embodiments contemplate different interfacial layers being formed in the first region 100 and second region 200 from what is formed in the third region 300 and the fourth region 400. Additional details of these interfacial layers are discussed below in the context of FIGS. 21, 22, and 23.

A gate dielectric layer can be formed on the interfacial layers. The gate dielectric layer can further include a high-k dielectric layer formed conformally on the top surface of the ILD0 54 and in the openings along sidewalls of the gate spacers 48 and on the interfacial dielectric. The high-k dielectric layer may have a k value greater than about 7.0, and may include a metal oxide or a silicate of Hf, Al, Zr, La, Mg, Ba, Ti, Pb, and combinations thereof. The formation methods of high-k dielectric layer may include ALD, CVD, Molecular-Beam Deposition (MBD), the like, or a combination thereof. Other embodiments contemplate other materials for the gate dielectric, such as materials that are not high-k.

The gate electrode is formed on the gate dielectric. The gate electrode can be a multi-layered structure. For example, the gate electrode can include a capping layer conformally formed on the gate dielectric, one or more work function tuning layers conformally formed on the capping layer, and a metal-containing material, such as a metal, formed on the work function tuning layers and filling the openings. In an example, the capping layer can comprise a first sub-layer on the gate dielectric formed of TiN or the like using ALD, CVD, or the like, and a second sub-layer on the first sub-layer formed of TaN or the like using ALD, CVD, or the like. The work function tuning layer(s) can be formed of TiAl, TiN, or the like using ALD, CVD, or the like. The metal-containing material can be tungsten (W), aluminum (Al), cobalt (Co), ruthenium (Ru), a combination thereof or the like deposited using CVD, physical vapor deposition (PVD), the like, or a combination thereof.

Next, a planarization process, such as a CMP, may be performed to remove the excess portions of the gate electrodes and the gate dielectrics, which excess portions are over the top surface of ILD0 54.

Although not depicted, an upper ILD (ILD1) can be deposited over the ILD0 54 and the gate stack 56, and contacts can then be formed through the ILD1 and ILD0 54 to the epitaxial source/drain regions 50 and 52. The ILD1 can be formed of a dielectric material such as PSG, BSG, BPSG, USG, or the like, and may be deposited by any suitable method, such as CVD and PECVD. Openings for contacts can be formed through the ILD1 and ILD0 54. The openings may be formed using acceptable photolithography and etching techniques. A liner, such as a diffusion barrier layer, an adhesion layer, or the like, and a conductive material can be formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD1. The remaining liner and conductive material can form contacts in the openings. An anneal process may be performed to form a silicide at the interface between the epitaxial source/drain regions 50 and 52 and the contacts. Further processing steps may be performed. For example, various Inter-Metal Dielectrics (IMD) and their corresponding metallizations may be formed over the ILD1.

FIGS. 13A, 13B, and 13C illustrate the recessing of the source/drain regions in the second region 200 and the third region 300 discussed above with respect to FIG. 11. FIG. 13A is a 3D view of the second region 200 and the third region 300 on the substrate 20. FIG. 13B is a cross-sectional view of the second region 200, which is also the cross-section B-B in FIG. 13A. FIG. 13C is a cross-sectional view of the third region 300, which is also the cross-section C-C in FIG. 13A. The recessing of the fins 32 in both the second region 200 and the third region 300 is performed in a same etch process. An etchant used in this etch process can etch the material of the heteroepitaxial layer 38 at a faster rate, including rates of anisotropic etching and isotropic etching, than the material of the regrowth layer 26. An example etch process includes using a dry etch using a F-based gas, Cl-based gas, or the like when the heteroepitaxial layer 38 is SiGe and the regrowth layer 26 is silicon.

As shown, a nearest distance 60 between outer surfaces of gate spacers 48 on neighboring stacks of a dummy dielectric, dummy gate 44, and mask 46 (collectively, "dummy stack 44/46") in the second region 200 is smaller than a nearest distance 62 between outer surfaces of gate spacers 48 on neighboring dummy stacks 44/46 in the third region 300. The different etch rates of the materials of the heteroepitaxial layer 38 and the regrowth layer 26 can offset the pattern-loading effect that can occur during etching, such as when distance 62 is greater than distance 60. As will be discussed in further detail with respect to FIGS. 15 and 16, a depth 64 of recesses formed in the second region 200 can be greater than a depth 66 of recesses formed in the third region 300.

FIGS. 14A, 14B, and 14C illustrate the epitaxial growth of the epitaxial source/drain regions 52' and 52" (collectively, 52) in the recesses in the second region 200 and the third region 300, respectively, discussed above with respect to FIG. 11. FIG. 14A is a 3D view of the second region 200 and the third region 300 on the substrate 20. FIG. 14B is a cross-sectional view of the second region 200, which is also the cross-section B-B in FIG. 14A. FIG. 14C is a cross-sectional view of the third region 300, which is also the cross-section C-C in FIG. 14A. The epitaxial growth of the epitaxial source/drain regions 52 in both the second region 200 and the third region 300 is performed in a same growth process. As will be discussed further in FIGS. 15 and 16, the epitaxial source/drain regions 52' in the second region 200 in FIG. 14B and the epitaxial source/drain regions 52" in the third region 300 in FIG. 14C can fill the respective recesses.

Figure 15:
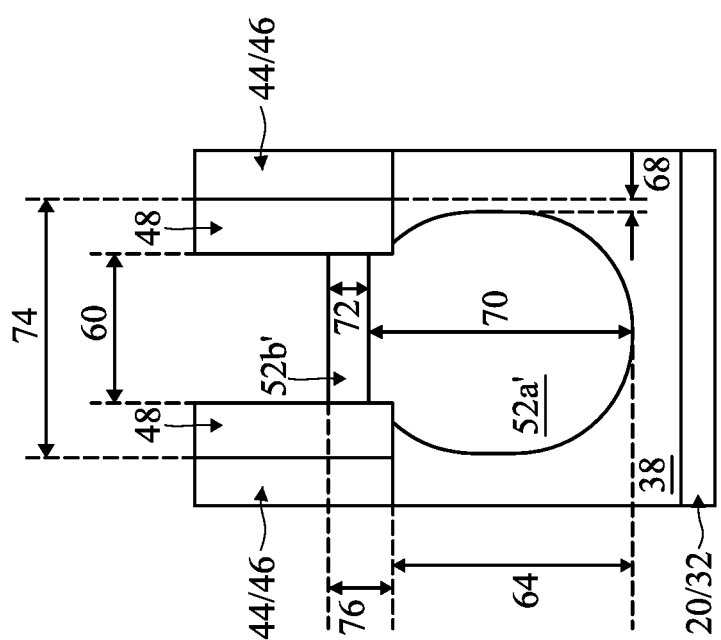
FIG. 15 is a cross-sectional view of an epitaxial source/drain region in a first region in accordance with some embodiments.

FIG. 15 illustrates a cross-sectional view of an epitaxial source/drain region 52', which includes a first portion 52a' and a second portion 52b', in the second region 200. As illustrated, the first portion 52a' of the epitaxial source/drain region 52' fills the recess, which was formed as discussed with respect to FIGS. 13A and 13B. The first portion 52a' may be, for example, $Si_xGe_{1-x}$, where x can be in a range from about 0.30 to 0.70, that is boron doped at a concentration in a range from about $7\times10^{20}$ $cm^{-3}$ to about $2\times10^{21}$ $cm^{-3}$. The second portion 52b' may be, for example, $Si_xGe_{1-x}$, where x can be in a range from about 0.00 to 0.40, that is boron doped at a concentration in a range from about $5\times10^{20}$ $cm^{-3}$ to about $2\times10^{21}$ $cm^{-3}$.

The epitaxial source/drain region 52' (e.g., the first portion 52a') in the second region 200 can have a proximity distance 68. The proximity distance 68 is a lateral distance between an outer surface of the epitaxial source/drain region 52' and a plane of a nearest sidewall surface of the nearest dummy stack 44/46. In some embodiments, the proximity distance 68 can be in a range from about 0 nm to about 8 nm. The first portion 52a' can have a thickness 70 from a bottom surface to a top surface. In some embodiments, the thickness 70 can be in a range from about 20 nm to about 40 nm. The second portion 52b' can have a thickness 72 from a bottom surface to a top surface. In some embodiments, the thickness 72 can be in a range from about 5 nm to about 10 nm. A distance 74 can be between opposing sidewalls of neighboring dummy stacks 44/46, which can also be the distance 60 plus two times a thickness of the gate spacers 48. In some embodiments, the distance 74 can be in a range from about 15 nm to about 36 nm. The epitaxial source/drain region 52' can have a raised height 76 from a top surface of the fin 32 (e.g., top surface of the heteroepitaxial layer 38) to a top surface of the epitaxial source/drain region 52' (e.g., the second portion 52b'). In some embodiments, the raised height 76 can be in a range from about 5 nm to about 10 nm.

Figure 16:
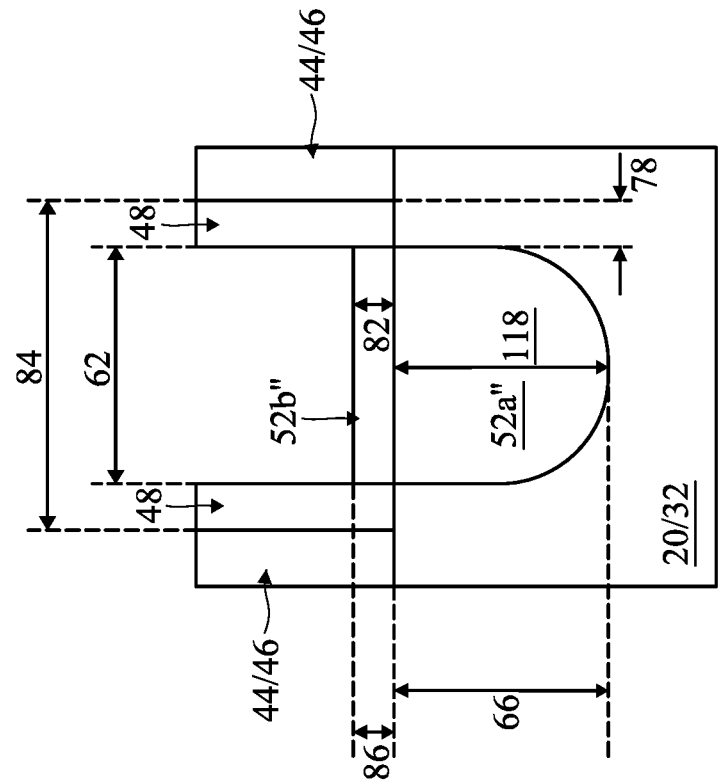
FIG. 16 is a cross-sectional view of an epitaxial source/drain region in a second region in accordance with some embodiments.

FIG. 16 illustrates a cross-sectional view of an epitaxial source/drain region 52", which includes a first portion 52a" and a second portion 52b", in the third region 300. As illustrated, the first portion 52a" of the epitaxial source/drain region 52" fills the recess, which was formed as discussed with respect to FIGS. 13A and 13C. The first portion 52a" may be, for example, $Si_xGe_{1-x}$, where x can be in a range from about 0.30 to 0.70, that is boron doped at a concentration in a range from about $7\times10^{20}$ $cm^{-3}$ to about $2\times10^{21}$ $cm^{-3}$. The second portion 52b" may be, for example, $Si_xGe_{1-x}$, where x can be in a range from about 0.00 to 0.40, that is boron doped at a concentration in a range from about $5\times10^{20}$ $cm^{-3}$ to about $2\times10^{21}$ $cm^{-3}$. The first portion 52a" in the epitaxial source/drain region 52" in the third region 300 can be epitaxially grown simultaneously with the first portion 52a' in the epitaxial source/drain region 52' in the second region 200. The second portion 52b" in the epitaxial source/drain region 52" in the third region 300 can be epitaxially grown simultaneously with the second portion 52b' in the epitaxial source/drain region 52' in the second region 200.

The epitaxial source/drain region 52" (e.g., the first portion 52a") in the third region 300 can have a proximity distance 78. The proximity distance 78 is a lateral distance between an outer surface of the epitaxial source/drain region 52" and a plane of a nearest sidewall surface of the nearest dummy stack 44/46. In some embodiments, the proximity distance 78 can be in a range from about 4 nm to about 15 nm. The first portion 52a" can have a thickness 80 from a bottom surface to a top surface. In some embodiments, the thickness 80 can be in a range from about 20 nm to about 40 nm. The second portion 52b" can have a thickness 82 from a bottom surface to a top surface. In some embodiments, the thickness 82 can be in a range from about 5 nm to about 10 nm. A distance 84 can be between opposing sidewalls of neighboring dummy stacks 44/46, which can also be the distance 62 plus two times a thickness of the gate spacers 48. In some embodiments, the distance 84 can be in a range from about 40 nm to about 100 nm. The epitaxial source/drain region 52" can have a raised height 86 from a top surface of the fin 32 (e.g., top surface of the regrowth layer 26) to a top surface of the epitaxial source/drain region 52" (e.g., the second portion 52b"). In some embodiments, the raised height 86 can be in a range from about 5 nm to about 10 nm.

The different etch rates during etching of the recesses for the epitaxial source/drain regions 52' and 52" in the second region 200 and the third region 300, respectively, can cause profiles of the epitaxial source/drain regions 52' and 52" to be different. For example, the depth 64 of the recesses in the second region 200 can be greater than the depth 66 of the recesses in the third region 300, even though distance 60 in the second region 200 is less than distance 62 in the third region. Similarly, an isotropic etch component of the etch can under-cut the gate spacers 48 more significantly in the second region 200 than the third region 300, such as due to the greater etch rate in the second region 200. This can result in the source/drain region 52" in the third region 300 having a greater proximity distance 78 than the proximity distance 68 of the source/drain region 52' in the second region 200. In some embodiments, the proximity distance 78 is in a range from about 2 nm to about 8 nm greater than the proximity distance 68.

Figure 17B:
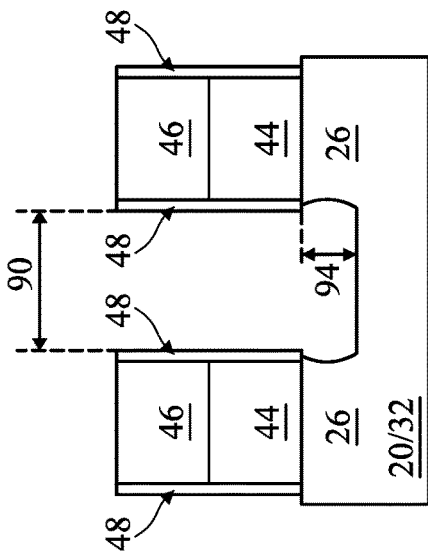
FIGS. 17A, 17B, and 17C are a 3D view and cross-sectional views illustrating recessing of source/drain regions in third and fourth regions in accordance with some embodiments.
Figure 17C:
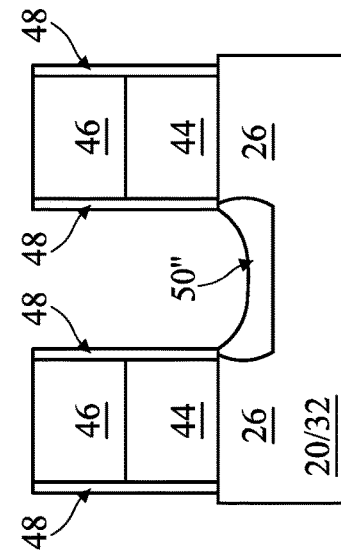
Figure 17A:
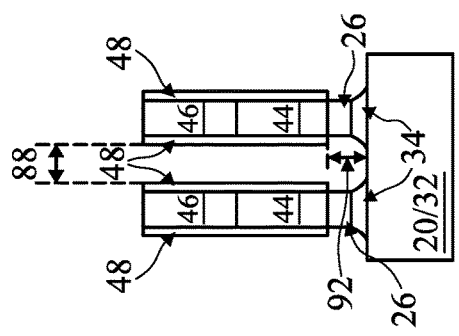

FIGS. 17A, 17B, and 17C illustrate the recessing of the source/drain regions in the first region 100 and the fourth region 400 discussed above with respect to FIG. 11. FIG. 17A is a 3D view of the first region 100 and the fourth region 400 on the substrate 20. FIG. 17B is a cross-sectional view of the first region 100, which is also the cross-section B-B in FIG. 17A. FIG. 17C is a cross-sectional view of the fourth region 400, which is also the cross-section C-C in FIG. 17A.

The recessing of the fins 32 in both the first region 100 and the fourth region 400 is performed in a same etch process. An example etch process includes using a dry etch using a F-based gas, Cl-based gas, or the like when the regrowth layer 26 is silicon.

As shown, a nearest distance 88 between outer surfaces of gate spacers 48 on neighboring dummy stacks 44/46 in the first region 100 is smaller than a nearest distance 90 between outer surfaces of gate spacers 48 on neighboring dummy stacks 44/46 in the fourth region 400. Due to the pattern-loading effect and the same material being etched, e.g., the regrowth layers 26, in the first region 100 and the fourth region 400, the regrowth layer 26 in the fourth region 400 can be etched at a faster rate than the regrowth layer 26 in the first region 100. As will be discussed in further detail with respect to FIGS. 19 and 20, a depth 92 of recesses formed in the first region 100 can be less than a depth 94 of recesses formed in the fourth region 400.

Figure 18B:
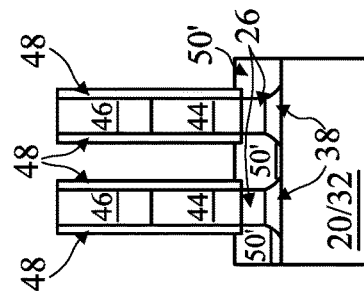
FIGS. 18A, 18B, and 18C are a 3D view and cross-sectional views illustrating formation of epitaxial source/drain regions in the recesses formed in FIGS. 17A, 17B, and 17C in accordance with some embodiments.
Figure 18C:
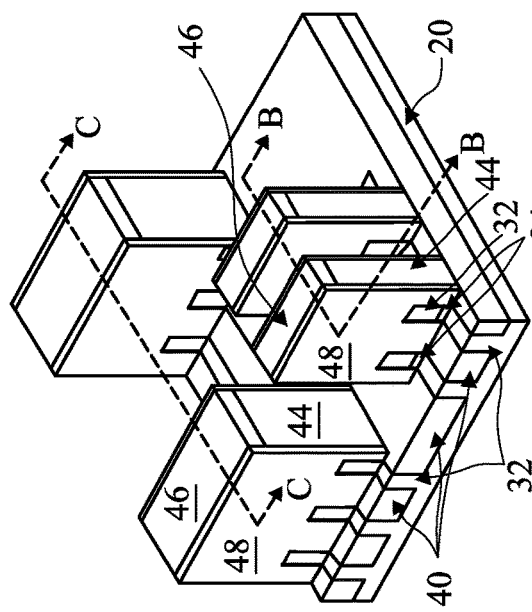
Figure 18A:
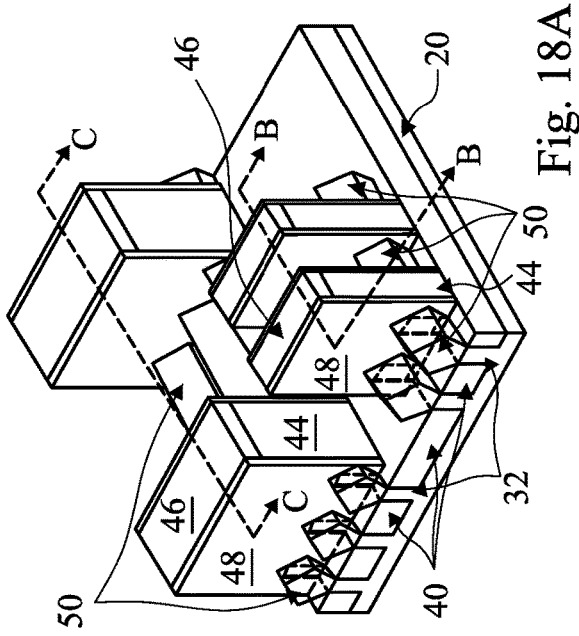

FIGS. 18A, 18B, and 18C illustrate the epitaxial growth of the epitaxial source/drain regions 50' and 50" (collectively, 50) in the recesses in the first region 100 and the fourth region 400 discussed above with respect to FIG. 11. FIG. 18A is a 3D view of the first region 100 and the fourth region 400 on the substrate 20. FIG. 18B is a cross-sectional view of the first region 100, which is also the cross-section B-B in FIG. 18A. FIG. 18C is a cross-sectional view of the fourth region 400, which is also the cross-section C-C in FIG. 18A. The epitaxial growth of the epitaxial source/drain regions 50 in both the first region 100 and the fourth region 400 is performed in a same growth process(es). As will be discussed further in FIGS. 19 and 20, the epitaxial source/drain regions 50' in the first region 100 in FIG. 18B can fill the recesses, while the epitaxial source/drain regions 50" in the fourth region 400 in FIG. 14C may not completely fill the recesses.

FIG. 19 illustrates a cross-sectional view of an epitaxial source/drain region 50', which includes first portions 50a', second portions 50b', and a third portion 50c', in the first region 100. As illustrated, the first portions 50a' of the epitaxial source/drain region 50' are formed on surfaces of a crystalline material, such as the regrowth layer 26 and the substrate 20, and not on a surface of non-crystalline material, such as the first dielectric material 34. Hence, FIG. 19 illustrates three distinct first portions 50a' along surfaces of the recess in the first region 100. The second portions 50b' of the epitaxial source/drain region 50' are formed on the first portions 50a', e.g., on surfaces of a crystalline material and not on surfaces of a non-crystalline material. The third portion 50c' of the epitaxial source/drain region 50' fills the remainder of the recess in the first region 100. Although the third portion 50c' may not nucleate and grow from surfaces of non-crystalline material such as the first dielectric material 34, growth fronts of the third portion 50c' can grow from neighboring surfaces of crystalline material and coalesce on a surface of non-crystalline material. The first portions 50a' may be, for example, Si that is undoped. The second portions 50b' may be, for example, SiP that is phosphorus doped at a concentration in a range from about $2\times10^{20}$ cm$^{-3}$ to about $8\times10^{20}$ cm$^{-3}$. The third portion 50c' may be, for example, SiP that is phosphorus doped at a concentration in a range from about $1\times10^{21}$ cm$^{-3}$ to about $3\times10^{21}$ cm$^{-3}$.

The epitaxial source/drain region 50' (e.g., first portions 50a') in the first region 100 can have a proximity distance 96. The proximity distance 96 is a lateral distance between an outer surface of the epitaxial source/drain region 50' and a plane of a nearest sidewall surface of the nearest dummy stack 44/46. In some embodiments, the proximity distance 96 can be in a range from about 2 nm to about 8 nm. The first portions 50a' can have a thickness 98. In some embodiments, the thickness 98 can be in a range from about 5 nm to about 30 nm. The second portions 50b' can have a thickness 102. In some embodiments, the thickness 102 can be in a range from about 5 nm to about 10 nm. The third portion 50c' can have a thickness 104. In some embodiments, the thickness 104 can be in a range from about 20 nm to about 50 nm. A distance 106 can be between opposing sidewalls of neighboring dummy stacks 44/46, which can also be the distance 88 plus two times a thickness of the gate spacers 48. In some embodiments, the distance 106 can be in a range from about 15 nm to about 36 nm. The epitaxial source/drain region 50' can have a raised height 108 from a top surface of the fin 32 (e.g., top surface of the regrowth layer 26) to a top surface of the epitaxial source/drain region 50' (e.g., the third portion 50c'). In some embodiments, the raised height 108 can be in a range from about 5 nm to about 10 nm. The first dielectric material 34 can have a thickness 110. In some embodiments, the thickness 110 can be in a range from about 5 nm to about 25 nm.

FIG. 20 illustrates a cross-sectional view of an epitaxial source/drain region 50", which includes a first portion 50a", a second portion 50b", and a third portion 50c", in the fourth region 400. As illustrated, the first portion 50a" of the epitaxial source/drain region 50" is a conformal layer along surfaces of a crystalline material (e.g., the regrowth layer 26 and/or the substrate 20) in the recess, which was formed as discussed with respect to FIGS. 17A and 17C. As illustrated, the second portion 50b" of the epitaxial source/drain region 50" is a conformal layer along surfaces of the first portion 50a". The third portion 50c" of the epitaxial source/drain region 50" is on the second portion 50b" and in some embodiments may not completely fill the remaining portion of the recess. The first portion 50a" may be, for example, Si that is undoped. The second portion 50b" may be, for example, SiP that is phosphorus doped at a concentration in a range from about $2\times10^{20}$ cm$^{-3}$ to about $8\times10^{20}$ cm$^{-3}$. The third portion 50c" may be, for example, SiP that is phosphorus doped at a concentration in a range from about $1\times10^{21}$ cm$^{-3}$ to about $3\times10^{21}$ cm$^{-3}$. The first portion 50a" in the epitaxial source/drain region 50" in the fourth region 400 can be epitaxially grown simultaneously with the first portions 50a' in the epitaxial source/drain region 50' in the first region 100. The second portion 50b" in the epitaxial source/drain region 50" in the fourth region 400 can be epitaxially grown simultaneously with the second portions 50b' in the epitaxial source/drain region 50' in the first region 100. The third portion 50c" in the epitaxial source/drain region 50" in the fourth region 400 can be epitaxially grown simultaneously with the third portion 50c' in the epitaxial source/drain region 50' in the first region 100.

The epitaxial source/drain region 50" (e.g., the first portion 50a") in the fourth region 400 can have a proximity distance 112. The proximity distance 112 is a lateral distance between an outer surface of the epitaxial source/drain region 50" and a plane of a nearest sidewall surface of the nearest dummy stack 44/46. In some embodiments, the proximity distance 112 can be in a range from about 2 nm to about 8 nm. The first portion 50a" can have a thickness 114. In some embodiments, the thickness 114 can be in a range from about 5 nm to about 30 nm. The second portion 50b" can have a thickness 116. In some embodiments, the thickness 116 can be in a range from about 5 nm to about 10 nm. The third portion 50c" can have a thickness 118. In some embodiments, the thickness 118 can be in a range from about 20 nm to about 50 nm. A distance 120 can be between opposing sidewalls of neighboring dummy stacks 44/46, which can also be the distance 90 plus two times a thickness of the gate spacers 48. In some embodiments, the distance 120 can be in a range from about 40 nm to about 100 nm. The epitaxial source/drain region 50" can be dished by, for example, a dimension 122 from a top surface of the fin 32 (e.g., top surface of the regrowth layer 26) to a top surface of the epitaxial source/drain region 50" (e.g., the third portion 50c"). In some embodiments, the dimension 122 can be in a range from about 5 nm to about 20 nm.

Due to the pattern-loading effect when etching the same materials of the regrowth layer 26 to form recesses for the epitaxial source/drain regions 50' and 50" in the first region 100 and the fourth region 400, respectively, profiles of the epitaxial source/drain regions 50' and 50" can be different. For example, the pattern-loading effect may cause an anisotropic component of the etching, which may be the dominant etching component, to etch at a faster rate in the fourth region 400 than the first region 100 because the distance 90 is greater than the distance 88. Hence, the depth 94 of the recess in the fourth region 400 may be greater than the depth 92 of the recess in the first region 100. For example, in some embodiments, the depth 94 of the recess in the fourth region 400 is in a range from about 3 nm to about 15 nm greater than the depth 92 of the recess in the first region 100. Further, the isotropic etching component may have a same or similar etching rate in the first region 100 and the fourth region 400. Hence, lateral under-cutting of the recessing under the dummy stacks 44/46 in the first region 100 and the fourth region 400 may be the same or similar, and the proximity distances 96 and 112 in the first region 100 and the fourth region 400 may be the same or similar.

Although the foregoing discussion references dummy stacks 44/46 in the context of certain dimensions, one having ordinary skill in the art will understand that such dimensions remain in the context of gate stacks 56 in the stead of dummy stacks 44/46 after the gate stacks 56 are formed in openings defined by the removal of dummy stacks 44/46. For example, a proximity distance may be a lateral distance between an outer surface of an epitaxial source/drain region 50 or 52 and a plane of a nearest sidewall surface of the nearest gate stack 56 (e.g., an outer sidewall surface of a conformal interfacial or gate dielectric layer).

Figure 21:
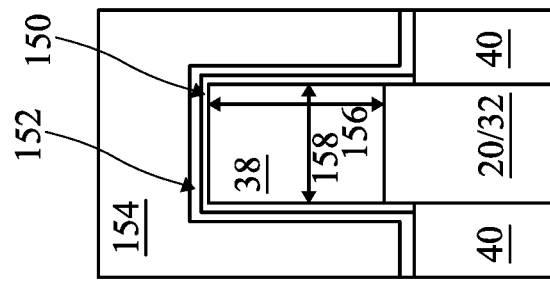
FIG. 21 is a cross-sectional view of a channel of a fin of a device formed in a second or fourth region in accordance with some embodiments.
Figure 22:
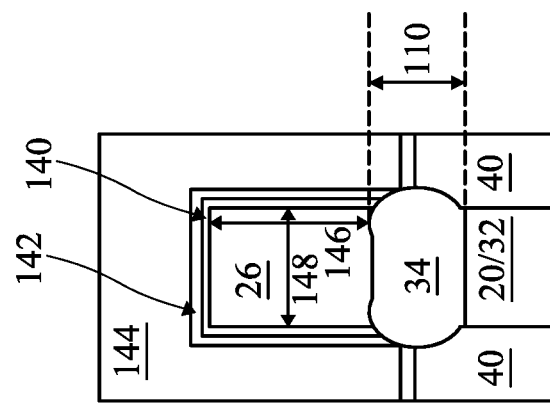
FIG. 22 is a cross-sectional view of a channel of a fin of a device formed in a third region in accordance with some embodiments.
Figure 23:
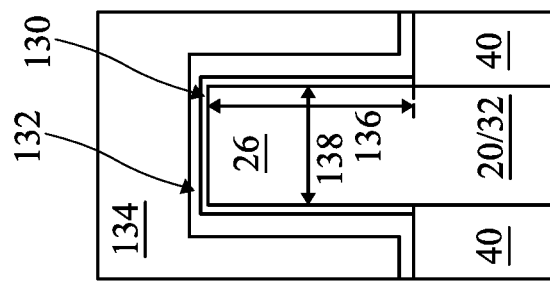
FIG. 23 is a cross-sectional view of a channel of a fin of a device formed in a first region in accordance with some embodiments.

FIGS. 21, 22, and 23 illustrate cross-sectional views of fins at channel regions of the devices that are formed in the regions 100, 200, 300, and 400. The devices are illustrated after forming gate stacks 56 as discussed above with respect to FIG. 12. For clarity, the cross-sectional views of FIGS. 21, 22, and 23 are perpendicular to the cross-sections B-B and C-C illustrated in FIGS. 14A and 18A.

FIG. 21 illustrates a cross-sectional view of a channel of a fin 32 of a device formed in the third region 300 and/or a channel of a fin of a device formed in the fourth region 400. FIG. 21 illustrates the fin 32, including the regrowth layer 26, protruding from above neighboring isolation regions 40. A gate stack 56 is on and over the fin 32 and includes an interfacial layer 130, a gate dielectric layer 132, and a gate electrode 134. The gate stack 56 can be formed as discussed above with respect to FIG. 12. In some embodiments, a thickness of the interfacial layer 130 can be in a range from about 2 nm to about 5 nm. The fin 32 can have a fin height 136 protruding above the isolation regions 40. The fin height 136 can be in a range from about 30 nm to about 60 nm in some embodiments. The fin 32 can have a fin width 138 from one sidewall surface to another sidewall surface. In some embodiments, the fin width 138 can be in a range from about 4 nm to about 10 nm.

FIG. 22 illustrates a cross-sectional view of a channel of a fin 32 of a device formed in the first region 100. FIG. 22 illustrates the fin 32, including the first dielectric material 34 and the regrowth layer 26, protruding from above neighboring isolation regions 40. A gate stack 56 is on and over the fin 32 and includes an interfacial layer 140, a gate dielectric layer 142, and a gate electrode 144. The gate stack 56 can be formed as discussed above with respect to FIG. 12. In some embodiments, a thickness of the interfacial layer 140 can be in a range from about 5 nm to about 15 nm. The fin 32, e.g., the regrowth layer 26 in this example, can have a fin height 146 protruding above the isolation regions 40 and above the first dielectric material 34. The fin height 146 can be in a range from about 30 nm to about 60 nm in some embodiments. In some embodiments, the first dielectric material 34 can be completely above or completely below top surfaces of the isolation regions 40. The fin 32, e.g., the regrowth layer 26 in this example, can have a fin width 148 from one sidewall surface to another sidewall surface. In some embodiments, the fin width 148 can be in a range from about 4 nm to about 10 nm.

FIG. 23 illustrates a cross-sectional view of a channel of a fin 32 of a device formed in the second region 200. FIG. 23 illustrates the fin 32, including the heteroepitaxial layer 38, protruding from above neighboring isolation regions 40. A gate stack 56 is on and over the fin 32 and includes an interfacial layer 150, a gate dielectric layer 152, and a gate electrode 154. The gate stack 56 can be formed as discussed above with respect to FIG. 12. In some embodiments, a thickness of the interfacial layer 150 can be in a range from about 5 nm to about 15 nm. The fin 32, e.g., the heteroepitaxial layer 38 in this example, can have a fin height 156 protruding above the isolation regions 40 and above an interface between the heteroepitaxial layer 38 and an underlying material. The fin height 156 can be in a range from about 30 nm to about 60 nm in some embodiments. In some embodiments, the heteroepitaxial layer 38 can be completely above top surfaces of the isolation regions 40 or can extend partially below the top surface of the isolation regions 40. The fin 32, e.g., the heteroepitaxial layer 38 in this example, can have a fin width 158 from one sidewall surface to another sidewall surface. In some embodiments, the fin width 158 can be in a range from about 4 nm to about 10 nm.

Some embodiments can achieve advantages. By having a different material as in channel regions of fins in different regions (e.g., second region 200 and third region 300), recess profiles can be manipulated when a simultaneous etching is performed for source/drain regions, which may offset a pattern-loading effect. This can advantageously result in different proximity distances in those different regions. The different proximity distances can result in increased reliability in an integrated circuit. For example, when the third region 300 is an I/O p-type device region and the second region 200 is a core logic p-type device region, a higher VDD may be used for an I/O p-type device in the third region 300 compared to a core logic p-type device in the second region, and hence, an increased proximity distance may be advantageous in the third region 300 compared to the second region 200. Some embodiments, such as described above, can be easily and simply integrated into process flows, and can be cost effective.

In an embodiment, a device includes: a substrate; a first fin extending from the substrate, the first fin including a first semiconductor material; a second fin extending from the substrate, the second fin including a second semiconductor material, the second semiconductor material being different from the first semiconductor material; a first gate stack on a first channel region of the first fin; a first spacer along a sidewall of the first gate stack; a second gate stack on a second channel region of the second fin, the first channel region and the second channel region having the same type of first majority carriers; a second spacer along a sidewall of the second gate stack; a first source/drain region in the first fin and adjacent the first channel region, the first source/drain region extending laterally under the first spacer by a first distance; and a second source/drain region in the second fin and adjacent the second channel region, the second source/drain region extending laterally under the second spacer by a second distance, the second distance being greater than the first distance.

In some embodiments of the device, the first majority carriers are electrons. In some embodiments of the device, the first semiconductor material is silicon germanium and the second semiconductor is silicon. In some embodiments of the device, a first distance from a topmost surface of the first fin to a bottommost surface of the first source/drain region is greater than a second distance from a topmost surface of the second fin to a bottommost surface of the second source/drain region. In some embodiments of the device, the first fin is disposed in a core logic region of the substrate, and the second fin is disposed in an input/output region of the substrate. In some embodiments of the device, a length of the first channel region is less than a length of the second channel region.

In an embodiment, a device includes: a substrate having a first region and a second region; a dielectric layer on the first region of the substrate; a first fin on the dielectric layer; a second fin extending from the second region of the substrate; a first gate stack on a first channel region of the first fin; a second gate stack on a second channel region of the second fin, the first channel region and the second channel region having the same type of first majority carriers; a first source/drain region in the first fin and adjacent the first channel region; and a second source/drain region in the second fin and adjacent the second channel region.

In some embodiments of the device, the first majority carriers are holes. In some embodiments of the device, the first fin and the second fin include the same semiconductor material. In some embodiments of the device, the semiconductor material is silicon. In some embodiments of the device, a first distance from a topmost surface of the first fin to a bottommost surface of the first source/drain region is less than a second distance from a topmost surface of the second fin to a bottommost surface of the second source/drain region. In some embodiments of the device, a width of the first source/drain region at a topmost surface of the first fin is less than a width of the second source/drain region at a topmost surface of the second fin. In some embodiments of the device, the first region of the substrate is a core logic region, and the second region of the substrate is an input/output region. In some embodiments of the device, the first source/drain region has a first proximity distance between a nearest surface of the first source/drain region to the first gate stack and a plane of a respective nearest sidewall of the first gate stack, the second source/drain region has a second proximity distance between a nearest surface of the second source/drain region to the second gate stack and a plane of a respective nearest sidewall of the second gate stack, and the second proximity distance is greater than the first proximity distance. In some embodiments of the device, the first source/drain region has a first portion contacting the first fin and a second portion contacting the dielectric layer. In some embodiments of the device, the first portion of the first source/drain region has a first concentration of second majority carriers, and the second portion of the first source/drain region has a second concentration of the second majority carriers, the first concentration being less than the second concentration.

In an embodiment, a method includes: forming a first dielectric layer on a portion of a substrate; forming a first fin on the first dielectric layer; forming a second fin, a third fin, and a fourth fin extending from portions of the substrate exposed by the first dielectric layer, the first fin, the third fin, and the fourth fin including a first semiconductor material; forming a first gate stack, a second gate stack, a third gate stack, and a fourth gate stack, respectively, on the first fin, the second fin, the third fin, and the fourth fin; simultaneously etching the second fin and the third fin to form recesses in the second fin and the third fin, the second fin being etched at a greater vertical rate and a greater lateral rate than the third fin; simultaneously etching the first fin and the fourth fin to form recesses in the first fin and the fourth fin, the first fin being etched at a lesser vertical rate and a greater lateral rate than the fourth fin; and epitaxially growing a first source/drain region, a second source/drain region, a third source/drain region, and a fourth source/drain region in, respectively, the recesses of the first fin, the second fin, the third fin, and the fourth fin.

In some embodiments of the method, the first semiconductor material is silicon and the second semiconductor material is silicon germanium. In some embodiments of the method, the first fin and the fourth fin have the same type of first majority carriers, and the second fin and the fourth fin have the same type of second majority carriers. In some embodiments of the method, the first fin and the second fin are in a core logic region of the substrate, and the third fin and the fourth fin are in an input/output region of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   a first fin extending from the substrate, the first fin comprising a first semiconductor material;
   a second fin extending from the substrate, the second fin comprising a second semiconductor material, the second semiconductor material being different from the first semiconductor material;
   a first gate stack on a first channel region of the first fin;
   a first spacer along a sidewall of the first gate stack;
   a second gate stack on a second channel region of the second fin, the first channel region and the second channel region having the same type of first majority carriers;
   a second spacer along a sidewall of the second gate stack;
   a first source/drain region in the first fin and adjacent the first channel region, the first source/drain region extending laterally under the first spacer by a first distance; and a second source/drain region in the second fin and adjacent the second channel region, the second source/drain region extending laterally under the second spacer by a second distance, the second distance being greater than the first distance.

2. The device of claim 1, wherein the first majority carriers are electrons.

3. The device of claim 1, wherein the first semiconductor material is silicon and the second semiconductor material is silicon germanium.

4. The device of claim 1, wherein a third distance from a topmost surface of the first fin to a bottommost surface of the first source/drain region is less than a fourth distance from a topmost surface of the second fin to a bottommost surface of the second source/drain region.

5. The device of claim 1, wherein the first fin is disposed in an input/output logic region of the substrate, and the second fin is disposed in a core region of the substrate.

6. The device of claim 1, wherein a length of the first channel region is greater than a length of the second channel region.

7. A device comprising:
a substrate having a first region and a second region;
a dielectric layer on the first region of the substrate;
a first fin on the dielectric layer;
a second fin extending from the second region of the substrate;
a first gate stack on a first channel region of the first fin;
a second gate stack on a second channel region of the second fin, the first channel region and the second channel region having the same type of first majority carriers;
a first source/drain region in the first fin and adjacent the first channel region; and
a second source/drain region in the second fin and adjacent the second channel region, wherein a first distance from a topmost surface of the first fin to a bottommost surface of the first source/drain region is less than a second distance from a topmost surface of the second fin to a bottommost surface of the second source/drain region.

8. The device of claim 7, wherein the first majority carriers are holes.

9. The device of claim 7, wherein the first fin and the second fin comprise the same semiconductor material.

10. The device of claim 9, wherein the semiconductor material is silicon.

11. The device of claim 7, wherein a width of the first source/drain region at a topmost surface of the first fin is less than a width of the second source/drain region at a topmost surface of the second fin.

12. The device of claim 7, wherein the first region of the substrate is a core logic region, and the second region of the substrate is an input/output region.

13. The device of claim 7, wherein the first source/drain region has a first proximity distance between a nearest surface of the first source/drain region to the first gate stack and a plane of a respective nearest sidewall of the first gate stack, the second source/drain region has a second proximity distance between a nearest surface of the second source/drain region to the second gate stack and a plane of a respective nearest sidewall of the second gate stack, and the second proximity distance is equal to the first proximity distance.

14. The device of claim 7, wherein the first source/drain region has a first portion contacting the first fin and a second portion contacting the dielectric layer.

15. The device of claim 14, wherein the first portion of the first source/drain region has a first concentration of second majority carriers, and the second portion of the first source/drain region has a second concentration of the second majority carriers, the first concentration being less than the second concentration.

16. The device of claim 7, wherein the second source/drain region has a first portion and a second portion, the first portion adjoining the second fin and the second channel region, the second portion disposed on the first portion, wherein the first portion has a first concentration of second majority carriers, and the second portion has a second concentration of the second majority carriers, the first concentration being less than the second concentration.

17. A method comprising:
forming a first dielectric layer on a portion of a substrate;
forming a first fin on the first dielectric layer;
forming a second fin, a third fin, and a fourth fin extending from portions of the substrate exposed by the first dielectric layer, the first fin, the third fin, and the fourth fin comprising a first semiconductor material, the second fin comprising a second semiconductor material;
forming a first gate stack, a second gate stack, a third gate stack, and a fourth gate stack, respectively, on the first fin, the second fin, the third fin, and the fourth fin;
simultaneously etching the second fin and the third fin to form recesses in the second fin and the third fin, the second fin being etched at a greater vertical rate and a greater lateral rate than the third fin;
simultaneously etching the first fin and the fourth fin to form recesses in the first fin and the fourth fin, the first fin being etched at a lesser vertical rate than the fourth fin, the first fin being etched at a same lateral rate as the fourth fin; and
epitaxially growing a first source/drain region, a second source/drain region, a third source/drain region, and a fourth source/drain region in, respectively, the recesses of the first fin, the second fin, the third fin, and the fourth fin.

18. The method of claim 17, wherein the first semiconductor material is silicon and the second semiconductor material is silicon germanium.

19. The method of claim 17, wherein the first fin and the fourth fin have the same type of first majority carriers, and the second fin and the fourth fin have the same type of second majority carriers.

20. The method of claim 19, wherein the first fin and the second fin are in a core logic region of the substrate, and the third fin and the fourth fin are in an input/output region of the substrate.

* * * * *